(12) United States Patent
Oguri et al.

(10) Patent No.: US 7,072,023 B2
(45) Date of Patent: Jul. 4, 2006

(54) POSITION DETECTION APPARATUS HAVING A PLURALITY OF DETECTION SECTIONS, AND EXPOSURE APPARATUS

(75) Inventors: Hisaaki Oguri, Kawasaki (JP); Toyoshige Sasaki, Yokohama (JP); Masanobu Hasegawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 499 days.

(21) Appl. No.: 10/059,294

(22) Filed: Jan. 31, 2002

(65) Prior Publication Data

US 2002/0093635 A1 Jul. 18, 2002

Related U.S. Application Data

(63) Continuation of application No. 09/388,372, filed on Sep. 1, 1999.

(30) Foreign Application Priority Data

Sep. 4, 1998 (JP) .......................................... 10-265797

(51) Int. Cl.
*G03B 27/42* (2006.01)
*G03B 27/52* (2006.01)
*G01R 31/26* (2006.01)
*G01J 1/00* (2006.01)
*G01B 11/00* (2006.01)

(52) U.S. Cl. ........................ 355/53; 355/55; 324/765; 250/491.1; 356/400

(58) Field of Classification Search ................. 355/53, 355/55; 324/765; 250/491.1; 356/400; 438/695
See application file for complete search history.

(56) References Cited

U.S. PATENT DOCUMENTS

| 5,091,691 A | | 2/1992 | Kamieniecki et al. .. 324/158 R |
| 5,593,800 A | * | 1/1997 | Fujioka et al. ................ 430/5 |

(Continued)

FOREIGN PATENT DOCUMENTS

| EP | 0 004 757 | 3/1979 |
| EP | 0 572 368 | 5/1993 |

(Continued)

*Primary Examiner*—Russell Adams
*Assistant Examiner*—Peter B Kim
(74) *Attorney, Agent, or Firm*—Fitzpatrick, Cella, Harper & Scinto

(57) ABSTRACT

A surface position detection apparatus of this invention includes a position detection section having a plurality of electrodes opposing the object surface to be measured, and a measurement device for selecting at least one electrode of the plurality of electrodes in accordance with the shape of the object surface, supplying an AC current to the selected electrode, and measuring the current flowing to the electrode, thereby measuring the distance between the electrode and object surface.

15 Claims, 22 Drawing Sheets

U.S. PATENT DOCUMENTS

| | | | |
|---|---|---|---|
| 5,642,056 A | 6/1997 | Nakajima et al. | 324/758 |
| 5,651,044 A * | 7/1997 | Klotz, Jr. et al. | 378/117 |
| 5,658,700 A | 8/1997 | Sakai | 430/30 |
| 5,661,408 A * | 8/1997 | Kamieniecki et al. | 324/675 |
| 5,683,547 A * | 11/1997 | Azuma et al. | 438/695 |
| 5,760,879 A | 6/1998 | Shinonaga et al. | 355/55 |
| 5,804,983 A | 9/1998 | Nakajima et al. | 324/758 |
| 5,917,580 A | 6/1999 | Ebinuma et al. | 355/53 |
| 5,988,971 A | 11/1999 | Fossey et al. | 414/416 |
| 6,014,203 A | 1/2000 | Ohkawa | 355/68 |
| 6,341,007 B1 | 1/2002 | Nishi et al. | 355/53 |

FOREIGN PATENT DOCUMENTS

| | | |
|---|---|---|
| EP | 0 790 479 | 2/1996 |
| EP | 0 867 771 A2 * | 9/1998 |
| GB | 2 312 514 | 10/1997 |
| JP | 57-204547 | 12/1982 |
| JP | 61-65433 | 4/1986 |
| JP | 3-253917 | 11/1991 |
| JP | 7-201698 | 8/1995 |
| JP | 7-302748 | 11/1995 |
| JP | 9-045608 | 2/1997 |
| JP | 9-236425 | 9/1997 |
| JP | 9-246356 | 9/1997 |
| JP | 9-293665 | 11/1997 |
| JP | 10-064980 | 3/1998 |
| JP | 10-141374 | 5/1998 |
| JP | 10-284393 | 10/1998 |
| JP | 10-289871 | 10/1998 |
| JP | 11-111610 | 4/1999 |
| JP | 11-121320 | 4/1999 |
| JP | 11-176735 | 7/1999 |
| JP | 11-191522 | 8/1999 |

* cited by examiner

F I G. 9
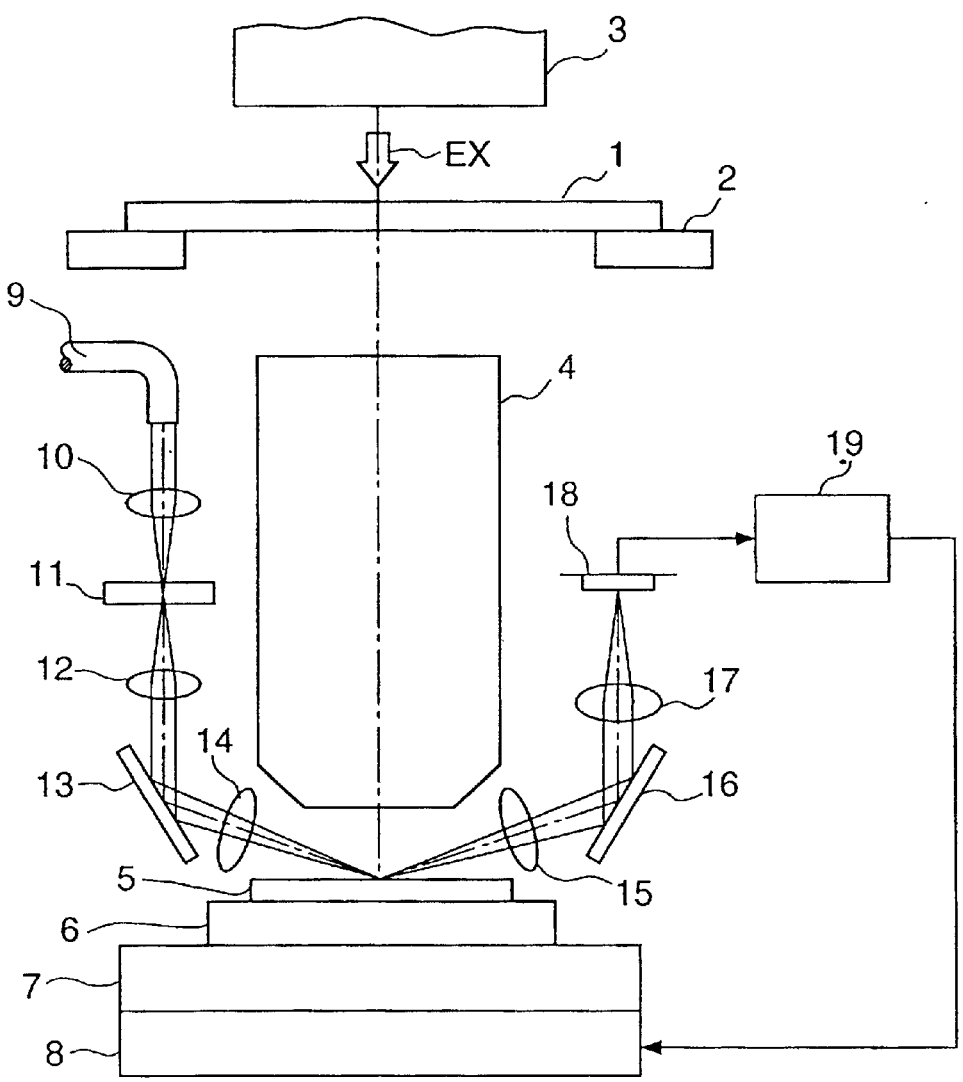

FIG. 12
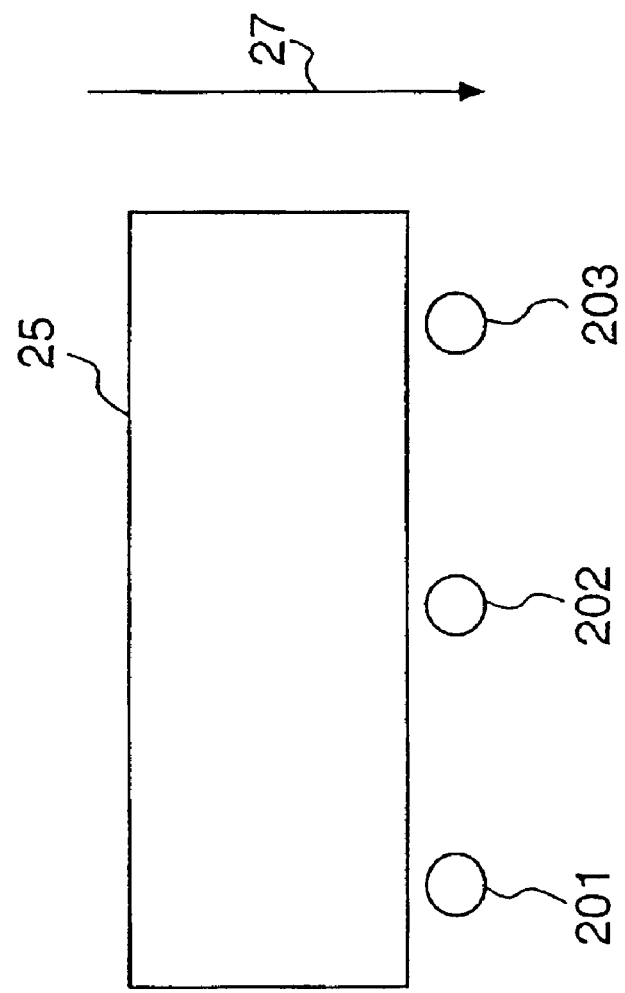
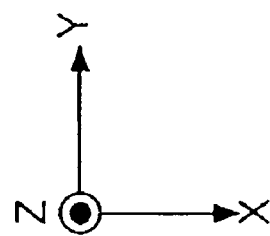

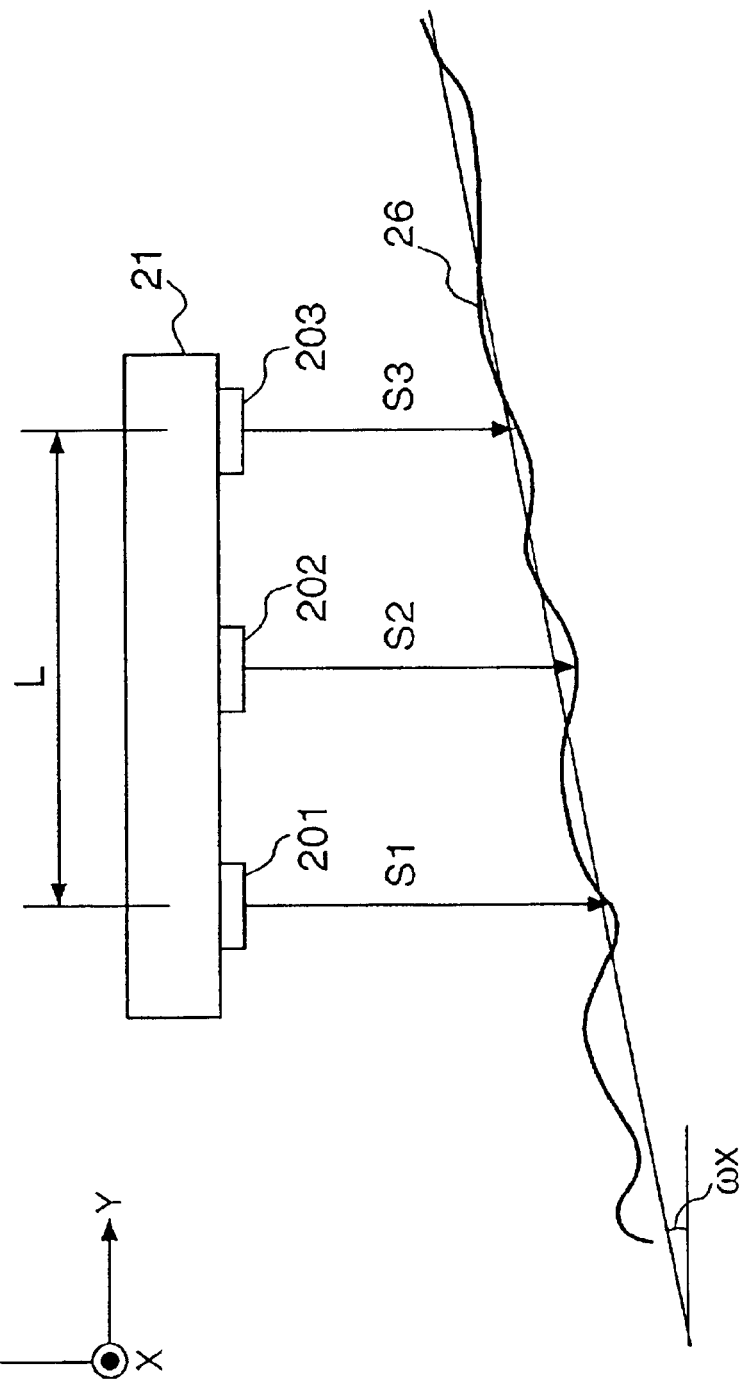

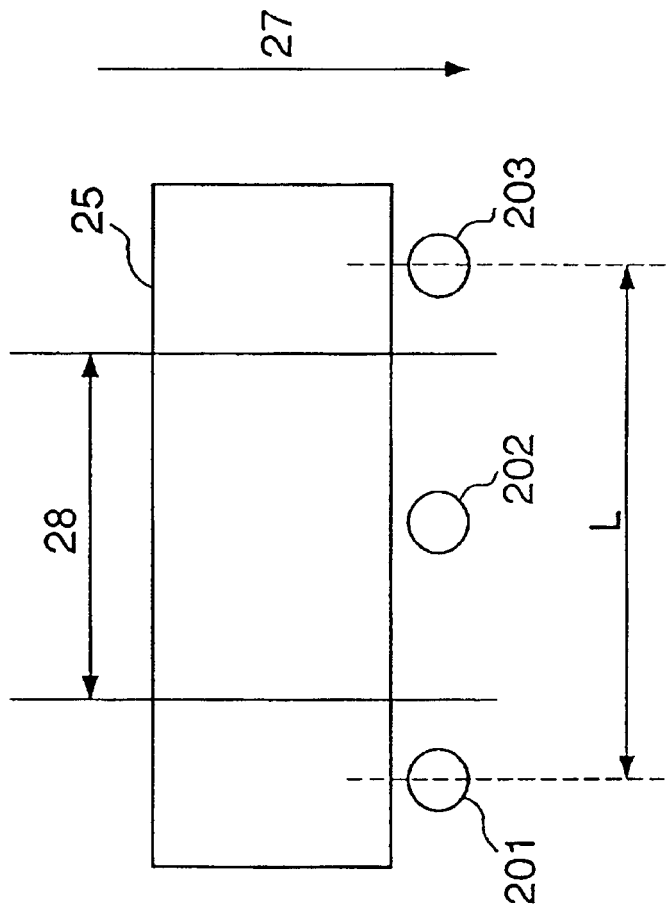
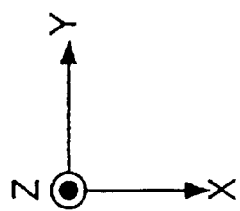

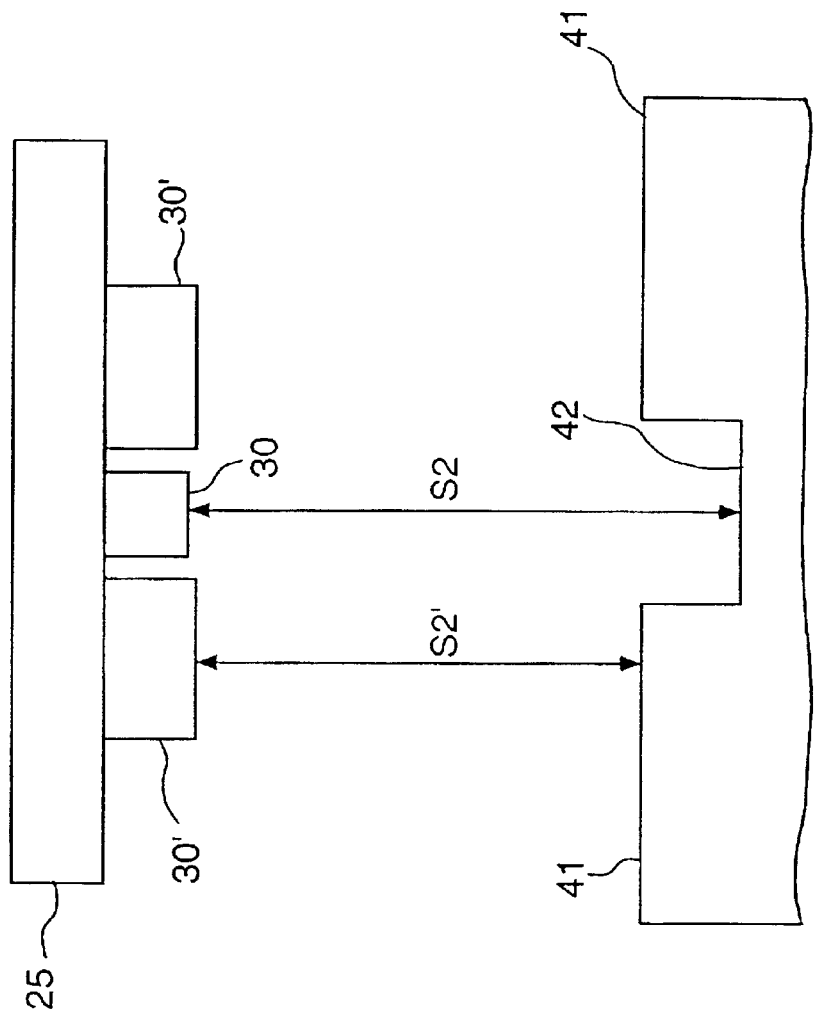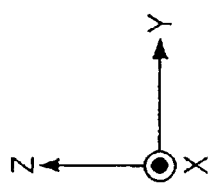

SEMICONDUCTOR DEIVCE MANUFACTURING FLOW

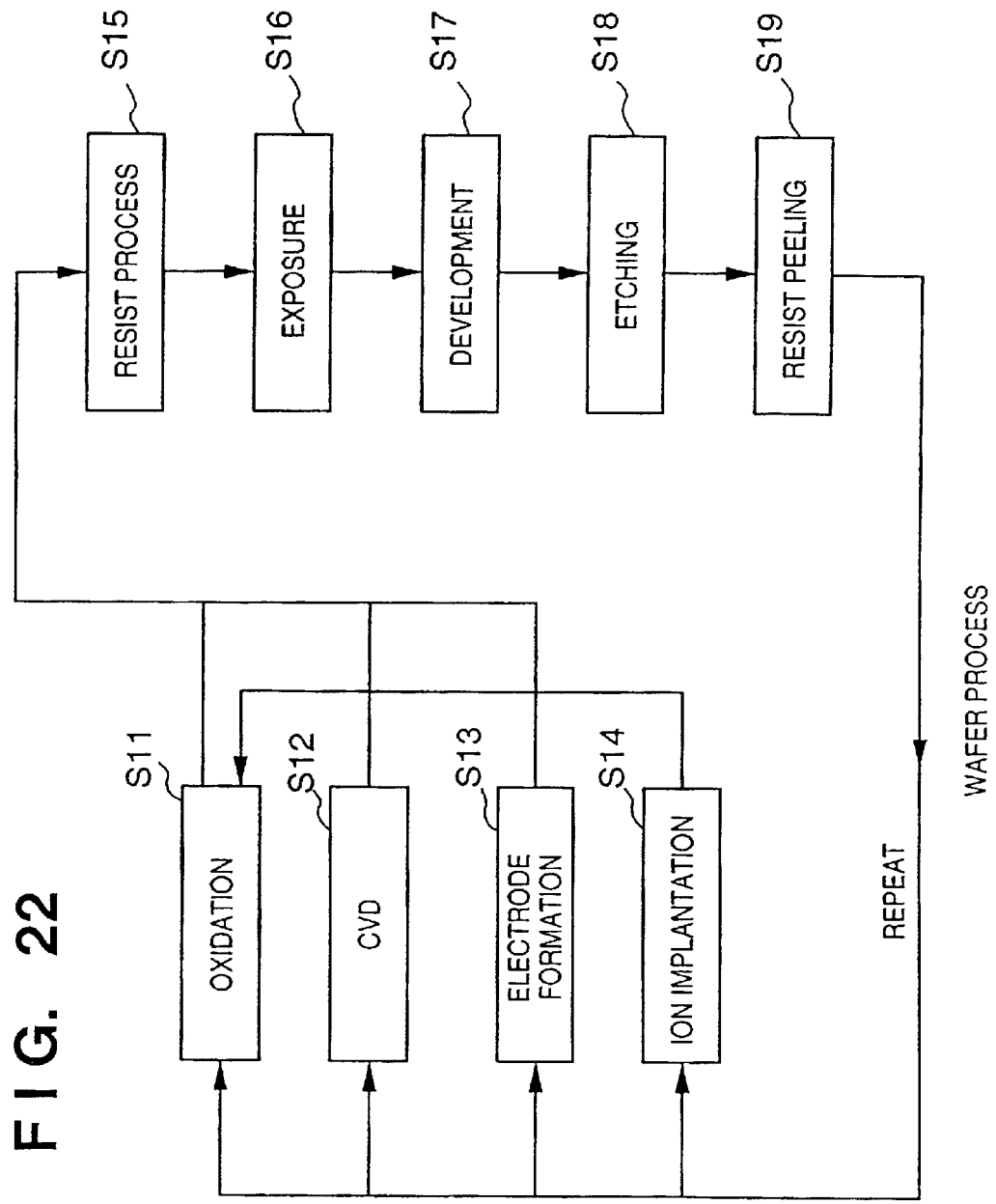

POSITION DETECTION APPARATUS HAVING A PLURALITY OF DETECTION SECTIONS, AND EXPOSURE APPARATUS

This application is a continuation of copending application Ser. No. 09/388,372, filed Sep. 1, 1999, and allowed on Oct. 23, 2001.

BACKGROUND OF THE INVENTION

1. Field of the Invention

The present invention relates to a position detection apparatus for detecting the surface position of an object, an exposure apparatus having the position detection apparatus, a control method therefor, and a device manufacturing method.

The position detection apparatus of the present invention can be applied to, e.g., a surface position measuring apparatus for measuring a small distance by an electrostatic scheme. The exposure apparatus of the present invention can be applied to, e.g., a slit-scan exposure apparatus.

2. Description of the Related Art

As surface position detection apparatuses for semiconductor exposure apparatuses, position detection apparatuses which obliquely irradiate a semiconductor wafer, placed at a position where a mask pattern is to be transferred through a projecting lens, with light from a projector, and detect light obliquely reflected by the surface of the semiconductor wafer to detect the surface position are widely used. FIG. 9 is a schematic view of such a conventional surface position detection apparatus.

As shown in FIG. 9, illumination light emitted from the output end of an optical fiber 9 illuminates a pattern forming plate 11 through a condenser lens 10. The illumination light passing through the pattern forming plate 11 is projected onto the exposure surface of a wafer 5 through a lens 12, mirror 13, and projection objective lens 14, so the image of the pattern on the pattern forming plate 11 is formed on the exposure surface of the wafer 5 from an oblique direction with respect to an optical axis EX. The illumination light reflected by the wafer 5 is reprojected onto the light-receiving surface of a light-receiving device 18 through a condenser objective lens 15, mirror 16, and imaging lens 17. The image of the pattern on the pattern forming plate 11 is formed on the light-receiving surface of the light-receiving device 18. When the wafer 5 moves in the vertical direction, the image of the pattern moves to the left or right on the light-receiving surface 18. When an arithmetic circuit 19 calculates the position of the pattern, the surface position of the wafer 5 can be detected.

In the exposure apparatus, such a focus detection system has a plurality of measurement points in one shot (area to be exposed) of a wafer. A surface position Z and tilt component (tilt) of the measurement shot are calculated by comparing the measurement results at the plurality of measurement points within the X-Y plane. Highly accurate focus position control is achieved by controlling a Z·tilt stage 8.

In recent years, a slit-scan exposure apparatus which exposes while holding a reticle and wafer conjugate with a projecting lens and scanning both the reticle and wafer to increase the exposure area has received a great deal of attention. In this exposure apparatus, a focus detection signal is directly used as a closed loop signal for controlling the posture of the stage. As the signal, a signal as smooth as possible, i.e., a signal averaged for an exposure area is necessary.

However, since the slit light projection scheme cannot measure position while uniformly illuminating a measurement surface of interest, the measurement areas always become discrete. In addition, experiments conducted by the present inventors have revealed that when a thin slit-like light beam irradiates the edge portion of a step, the reflected light is scattered to generate a large focus detection error.

This problem can be solved by using an electrostatic sensor as a focus detection sensor. An electrostatic sensor is more advantageous as a focus detection sensor of a slit-scan exposure apparatus than an optical sensor because it can almost uniformly average within the detection area, does not generate any focus detection error at an edge portion, and has a high response speed.

FIG. 10 is a view showing the principle of distance measurement by an electrostatic sensor. Referring to FIG. 10, a flat electrode 30 used for measurement is arranged near an object 31 to be measured. A high-frequency voltage is applied from an oscillator OS to the flat electrode 30. An ammeter AM is connected between the flat electrode 30 and oscillator OS. The ammeter AM and a measurement device (circuit) 32 connected to the ammeter AM measure the magnitude of an AC current flowing to the flat electrode 30. The current measurement result is input to an arithmetic circuit 33. A distance $d_o$ between the flat electrode 30 and the object 31 to be measured is measured by arithmetic processing by the arithmetic circuit 33.

Although the above-described surface position detection apparatus can obtain high accuracy in detecting the surface position of a substrate having a chip layout (pattern of a chip) compatible with the apparatus, no high accuracy can be obtained in detecting the surface position of a substrate having a chip layout incompatible with the apparatus.

In addition, when the shape of the wafer surface changes to a shape incompatible with the apparatus because of the repeated lithography process, the above-described surface position detection apparatus cannot accurately detect the surface position of the substrate.

SUMMARY OF THE INVENTION

The present invention has been made in consideration of the above situation, and has as its object to accurately detect the surface position of an object to be measured independently of the surface state of the object.

According to the first aspect of the present invention, there is provided a position detection apparatus for detecting a position of an object surface in a direction normal thereto, comprising at least two detection sections, a selection section for selecting at least one detection section from the at least two detection sections, and a measurement device for measuring the position of the object surface in the direction normal thereto using the detection section selected by the selection section.

In the position detection apparatus according to the first aspect, preferably, for example, each of the at least two detection sections has an electrode, and the measurement device applies an electrical signal containing an AC component to the electrode of the selected detection section to measure a distance between the electrode and the object surface.

In the position detection apparatus according to the first aspect, for example, the electrodes of the at least two detection sections preferably oppose different portions of the object surface.

In the position detection apparatus according to the first aspect, for example, the electrodes of the at least two detection sections are preferably in one plane.

In the position detection apparatus according to the first aspect, for example, the electrodes of the at least two detection sections are preferably concentric with each other.

In the position detection apparatus according to the first aspect, for example, the selection section preferably alternatively selects one detection section from the at least two detection sections.

In the position detection apparatus according to the first aspect, for example, the selection section determines the number of detection sections to be used for measurement.

In the position detection apparatus according to the first aspect, for example, the selection section preferably selects at least one detection section in accordance with a shape of the object surface.

In the position detection apparatus according to the first aspect, for example, preferably, the apparatus comprises at least two sets of the at least two detection sections, the selection sections, and the measurement devices, and further comprises an arithmetic section for calculating a tilt of the object surface on the basis of a measurement result by the at least two measurement device.

According to the second aspect of the present invention, there is provided an exposure apparatus having a projecting lens for projecting a pattern onto a substrate, a stage which moves while supporting the substrate, a position detection section for detecting a position of a substrate surface in a direction of an optical axis, and a control section for controlling the stage on the basis of an output from the position detection section, the position detection section comprising at least two detection sections, a selection section for selecting at least one detection section from the at least two detection sections, and a measurement device for measuring a position of the substrate in a direction normal thereto using the detection section selected by the selection section.

In the exposure apparatus according to the second aspect, preferably, for example, each of the at least two detection sections has an electrode, and the measurement device applies an electrical signal containing an AC component to the electrode of the selected detection section to measure a distance between the electrode and the substrate surface.

In the exposure apparatus according to the second aspect, for example, the electrodes of the at least two detection sections preferably oppose different portions of the substrate surface.

In the exposure apparatus according to the second aspect, for example, the electrodes of the at least two detection sections are preferably in one plane.

In the exposure apparatus according to the second aspect, for example, the selection section alternatively selects one detection section from the at least two detection sections.

In the exposure apparatus according to the second aspect, for example, the selection section preferably determines the number of detection sections to be used for measurement.

In the exposure apparatus according to the second aspect, for example, the selection section preferably selects at least one detection section in accordance with a shape of the substrate surface.

In the exposure apparatus according to the second aspect, for example, the selection section preferably selects at least one detection section in accordance with a position of the stage or the substrate.

In the exposure apparatus according to the second aspect, for example, the selection section preferably selects the detection section to be used for measurement to measure the position of the substrate in a direction other than in a direction normal thereto on a scribing line of the substrate.

In the exposure apparatus according to the second aspect, for example, the selection section preferably determines the number of detection sections for measurement in accordance with the pattern formed on the substrate.

In the exposure apparatus according to the second aspect, for example, the selection section preferably determined detection sections to be used for measurement in accordance with a position of an exposure area on the substrate.

In the exposure apparatus according to the second aspect, for example, the selection section preferably determines the number of detection sections to be used for measurement to reflect, on the measurement result, a position of an exposure area on the substrate in the direction normal thereto where high resolving performance is required.

According to the third aspect of the present invention, there is provided an exposure apparatus having a projecting lens for projecting a pattern onto a substrate, a stage which moves while supporting the substrate, first and second position detection sections for detecting a position of a substrate surface in a direction of an optical axis, and a control section for controlling a tilt of the stage on the basis of outputs from the first and second position detection sections, each of the first and second position detection sections comprising at least two detection sections, a selection section for selecting at least one detection section from the at least two detection sections, and a measurement device for measuring a position of the substrate in a direction normal thereto using the detection section selected by the selection section.

In the exposure apparatus according to the third aspect, preferably, for example, each of the at least two detection sections has an electrode, and the measurement device applies an electrical signal containing an AC component to the electrode of the selected detection section to measure a distance between the electrode and the substrate surface.

In the exposure apparatus according to the third aspect, for example, the electrodes of the at least two detection sections preferably oppose different portions of the substrate surface.

In the exposure apparatus according to the third aspect, for example, the electrodes of the at least two detection sections are preferably in one plane.

In the exposure apparatus according to the third aspect, for example, the electrodes of the at least two detection sections are preferably concentric with each other.

In the exposure apparatus according to the third aspect, for example, each of the selection section of the first position detection section and the selection section of the second position detection section preferably selects a detection section such that both the detection section of the first position detection section and the detection section of the second position detection section, which are to be used for measurement, are positioned on an inner area of a width of the pattern projected by the projecting lens and a distance between the detection sections is maximized. Preferably, the substrate is exposed while projecting slit-shaped light onto the substrate through the projecting lens and moving the stage.

In the exposure apparatus according to the third aspect, for example, each of the selection section of the first position detection section and the selection section of the second position detection section preferably selects a detection section such that both the detection section of the first position detection section and the detection section of the second position detection section, which are to be used for measurement, are positioned inside a width of the pattern projected by the projecting lens on the substrate and a distance between the detection sections is maximized. Preferably, the substrate is exposed while projecting slit-shaped light onto the substrate through the projecting lens and moving the stage.

According to the fourth aspect of the present invention, there is provided a position detection method of detecting a position of an object surface in a direction normal thereto, comprising the selection step of selecting at least one detection section from at least two detection sections, and the measurement step of measuring the position of the object surface in the direction normal thereto using the selected detection section.

According to the fifth aspect of the present invention, there is provided a method of controlling an exposure apparatus having a projecting lens for projecting a pattern onto a substrate, a stage which moves while supporting the substrate, a position detection section for detecting a position of a substrate surface in a direction of an optical axis, and a control section for controlling the stage on the basis of an output from the position detection section, comprising the selection step of selecting at least one detection section from at least two detection sections, and the measurement step of measuring a position of the substrate in a direction normal thereto using the selected detection section.

According to the sixth aspect of the present invention, there is provided a method of controlling an exposure apparatus having a projecting lens for projecting a pattern onto a substrate, a stage which moves while supporting the substrate, first and second position detection sections for detecting a position of a substrate surface in a direction of an optical axis, and a control section for controlling a tilt of the stage, each of the first and second position detection sections comprising at least two detection sections, comprising the selection step of selecting at least one detection section from the at least two detection sections of the first position detection section and at least one detection section from the at least two detection sections of the second position detection section, and the measurement step of measuring the tilt of the substrate using the selected detection section of the first position detection section and the selected detection section of the second position detection section.

According to the seventh aspect of the present invention, there is provided a device manufacturing method comprising the steps of placing a substrate applied with a resist film on a stage of an exposure apparatus, selecting at least one detection section of at least two detection sections for measuring a position of the substrate in a direction of an optical axis and measuring the position of the substrate on the stage in the direction of the optical axis using the selected detection section, controlling the stage in accordance with a measurement result in the measurement step, forming a pattern on the substrate on the stage by exposure, and developing the substrate.

According to the eighth aspect of the present invention, there is provided a device manufacturing method comprising the steps of placing a substrate applied with a resist film on a stage of an exposure apparatus, selecting at least one detection section from each of two position detection sections each having at least two detection sections for measuring a position of the substrate in a direction of an optical axis and measuring a tilt of the substrate on the stage using the selected detection sections, controlling the tilt of the stage in accordance with a measurement result in the measurement step, forming a pattern on the substrate on the stage by exposure, and developing the substrate.

According to the present invention, the height or tilt of an object surface can be accurately measured independently of the surface shape of the object.

According to the ninth aspect of the present invention, there is provided a surface position detection apparatus which uses an electrostatic sensor having an electrode arranged on a surface to be measured, voltage application means for applying a high-frequency voltage between the electrode and the surface to be measured, and detection means for detecting a distance between the surface to be measured and the electrode on the basis of a value of a current flowing when the high-frequency voltage is applied between the electrode and the surface to be measured, the electrostatic sensor having a plurality of electrodes as the electrode, and selection means for selecting the electrode to be used.

According to the tenth aspect of the present invention, there is provided an exposure apparatus comprising the surface position detection apparatus for detecting a position of a surface to be exposed, and means for controlling the selection means in correspondence with a state of the surface to be exposed, whose surface position is to be detected.

According to the eleventh aspect of the present invention, there is provided a device manufacturing method using the exposure apparatus, comprising the steps of detecting a surface position of a substrate to be exposed while appropriately selecting an electrode to be used in each electrostatic sensor by the surface position detection apparatus of the exposure apparatus, and exposing the substrate while controlling the position of the substrate to be exposed on the basis of a detection result.

According to this arrangement, even when the chip layout of a print pattern of a wafer, i.e., the surface to be detected changes, an electrode to be used in each electrostatic sensor is selected in correspondence with the change. Distance measurement for surface position detection is performed by making the electrode oppose a preferable measurement position or measurement area. Since the electrode is simply selected by the selection means, the high-frequency voltage to be applied is common to the electrodes appropriately selected in each electrostatic sensor and, therefore, is constant for the electrodes. Hence, accurate surface position detection is performed in correspondence with a change in the surface to be detected.

According to a preferred aspect of the present invention, the electrostatic sensor comprises a variable distance measurement position electrostatic sensor having, as the selection means, switching means for switching the electrode to be used to change the measurement position or switching means for switching the number of electrodes to be used to change the measurement area.

The exposure apparatus is of a slit-scan type and comprises a surface position detection apparatus with the variable distance measurement position electrostatic sensor to detect tilt by pre-measurement for focus position control of the surface to be exposed, and means for controlling the switching means such that the measurement position by two electrodes of each of two different electrostatic sensors of the surface position detection apparatus is set on an outermost side within a scanning exposure width. Alternatively, the exposure apparatus comprises a surface position detection apparatus having the variable distance measurement position electrostatic sensor to detect a position in a direction of an exposure optical axis by pre-measurement for focus position control of the surface to be exposed, and means for controlling the switching means such that the surface position is not detected at a scribing line position.

The slit-scan exposure apparatus may comprise a surface position detection apparatus having the variable distance measurement position electrostatic sensor to detect the position in the direction of the exposure optical axis for pre-measurement for focus position control of the surface to be exposed. In this case, the exposure apparatus comprises means for controlling the switching means such that a large part of an exposure surface position where high resolving performance is required is included in the measurement area.

The means for controlling the switching means can perform control on the basis of the exposure layout. Under the control, even when the exposure width becomes small, electrodes are selected such that the electrodes for calculating the tilt angle of the surface to be exposed are located within the width, thereby performing accurate focus position control. In addition, if a scribing line is located within the exposure slip, the electrode can be switched to cope with a plurality of chip patterns. In the surface position detection apparatus having the variable distance measurement position electrostatic sensor, the detection area to be averaged can be changed by switching the electrode to cope with a plurality of different chip layouts.

Further objects, features and advantages of the present invention will become apparent from the following detailed description of the embodiments of the present invention with reference to the accompanying drawings.

BRIEF DESCRIPTION OF THE DRAWINGS

FIG. 9 is a schematic view showing a conventional surface position detection apparatus;

FIG. 12 is a view showing the layout of electrostatic sensors in the conventional surface position detection apparatus;

FIG. 13 is a view for explaining a parameter calculation method for surface position control;

FIG. 14 is an explanatory view of the first problem of the conventional surface position detection apparatus that uses electrostatic sensors;

FIG. 20 is an explanatory view of a problem posed when a memory circuit is formed by exposure;

FIG. 22 is a flow chart showing details of the wafer process shown in FIG. 21.

DETAILED DESCRIPTION OF THE PREFERRED EMBODIMENTS (First Embodiment)

Figure 11:
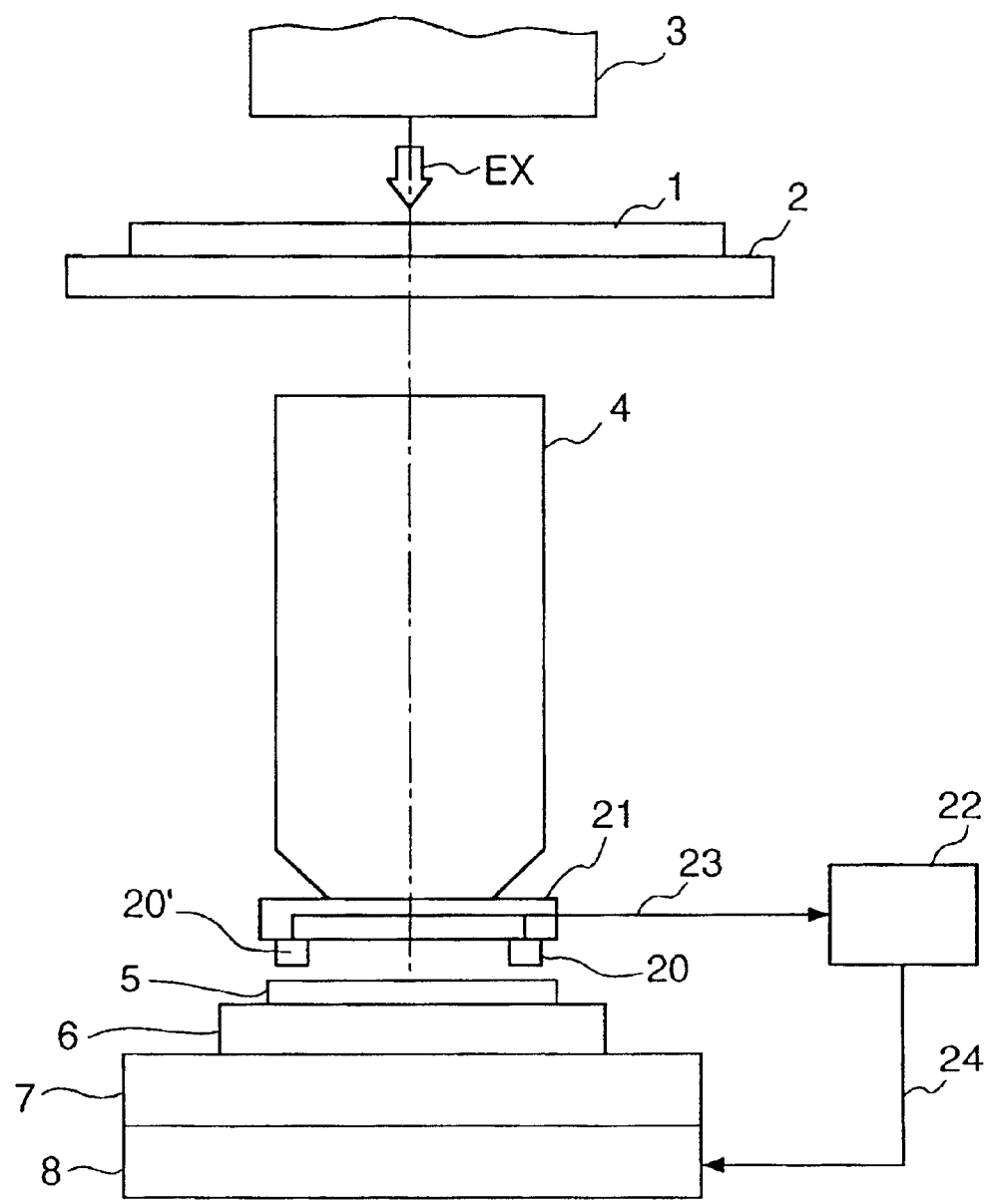
FIG. 11 is a schematic view showing a surface position detection apparatus using electrostatic sensors.

FIG. 11 is a schematic view showing an exposure apparatus to which a surface position detection apparatus according to the first embodiment of the present invention can be applied. Referring to FIG. 11, reference numeral 1 denotes a reticle; 2, a reticle scanning stage (the scanning direction is the X direction); 3, an illumination system for exposing a wafer; 4, a reduction projecting lens; 5, a wafer; 6, a wafer chuck; 7, an X-Y stage; 8, a Z-tilt stage; and 20 and 20', electrostatic sensors constructing part of the surface position detection apparatus. The electrostatic sensors 20 and 20' cannot measure the-surface position of the wafer 5 at the exposure position. So to pre-measure the surface position of the wafer 5, when the wafer stage is to be scanned to the right (positive direction of the X axis), the sensor 20 is used, and when the wafer stage is to be scanned to the left (negative direction of the X axis), the sensor 20' is used. A member 21 fixes the electrostatic sensors 20 and 20' in position. To ground the electrostatic sensors through their housing, the member 21 is made of a metal material such as aluminum and grounded. Reference numeral 22 denotes a control circuit; 23, a detection signal (to ten-odd kHz) from the electrostatic sensor; and 24, a Z-tilt stage control signal. Each of the electrostatic sensors 20 and 20' comprises at least two sensors lined up in the Y direction so as to detect yawing (ωx) in scanning the wafer stage in the X direction. On the basis of the detection signal 23 from the electrostatic sensors 20 and 20', the control circuit 22 calculates a surface position Z and tilt component (tilt) of the wafer 5 and controls the Z-tilt stage 8, thereby accurately controlling the focus position.

FIG. 12 is a view showing a conventional layout of electrostatic sensors when viewed from one direction of the optical axis. Reference numeral 25 denotes an exposure slit; and 27, a scanning direction. In this example, three sensors 201 to 203 are used as an electrostatic sensor (corresponding to the electrostatic sensor 20) to detect the height and tilt of a wafer. Since the electrostatic sensors cannot directly measure the surface position at the exposure position, premeasurement is performed by the sensors 201 to 203 mounted at positions separated from the exposure slit 25 by a predetermined distance in the scanning direction. Actually, since scanning is performed in the negative direction of the X axis, similar sensors must be mounted as an electrostatic sensor (corresponding to the electrostatic sensor 20') in the negative direction, as described above with reference to FIG. 11, though they are not illustrated for descriptive convenience.

FIG. 13 is a view showing the arrangement in FIG. 12 when viewed from one scanning direction (positive side of the Y axis). Reference numeral 26 denotes a surface (conductor) of an object (wafer) to be measured. The same reference numerals as in FIGS. 11 and 12 denote the same parts in FIG. 13. Referring to FIG. 13, the sensor 202 is used to detect the height of the wafer, and the sensors 201 and 203 are used to detect its tilt. Let S1, S2, and S3 be the outputs from the sensors 201 to 203, respectively. Then, the height Z [μm] and tilt ωx [rad.] are given by $$Z = S2 \ [\mu m]$$

$$\omega x = (S1 - S3)/L \ [rad.]$$

(where L is the distance between the sensors 201 and 203).

Figure 1:
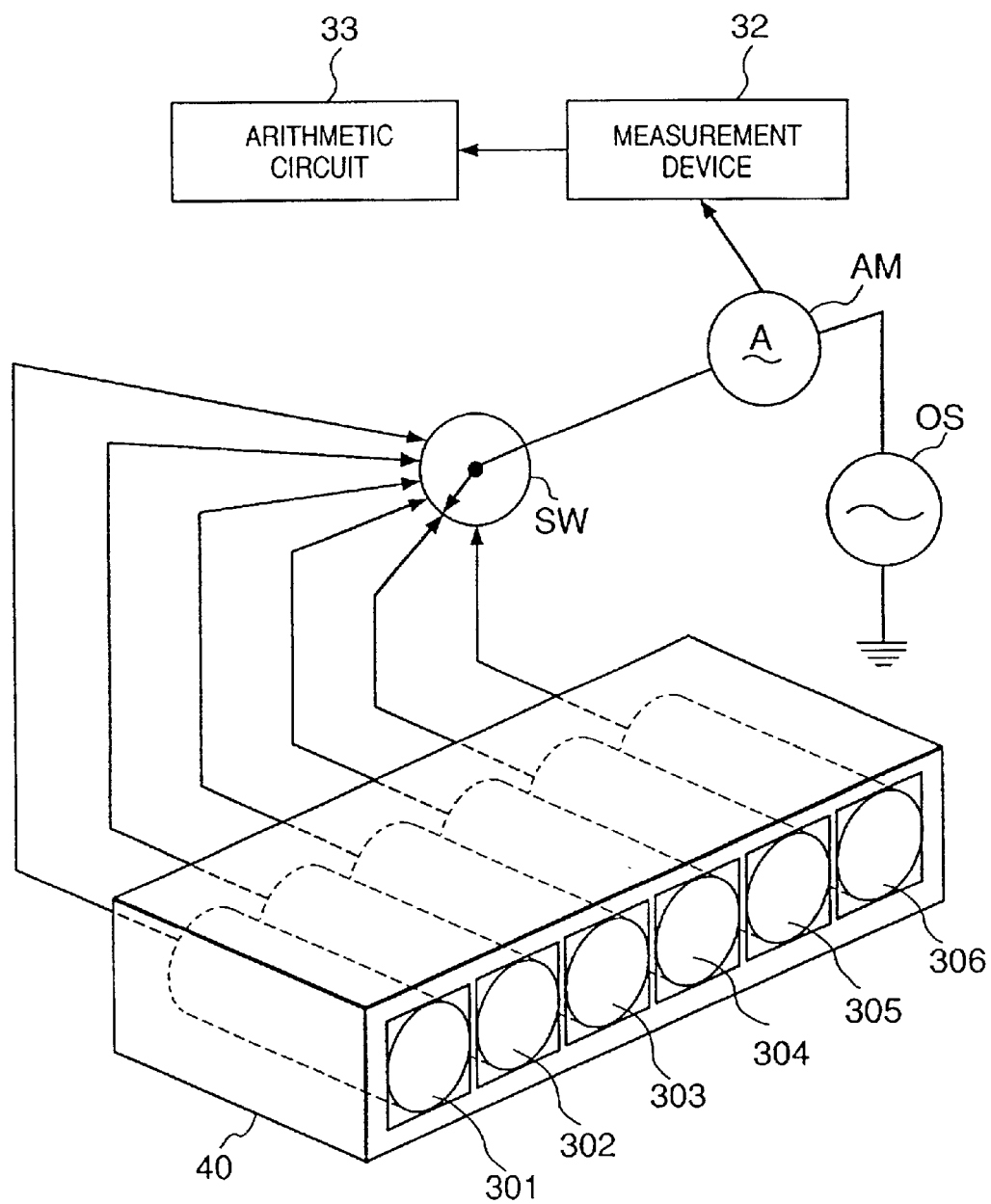
FIG. 1 is a view showing a variable distance measurement position electrostatic sensor of a surface position detection apparatus according to the first embodiment of the present invention.

FIG. 1 shows a variable distance measurement position electrostatic sensor used in the surface position detection apparatus of this embodiment, which is preferably stored in the exposure apparatus shown in FIG. 11. Reference numerals 301 to 306 denote sensor electrodes. The section of each sensor electrode need not always be circular, as shown in FIG. 1. A change-over switch SW is used to arbitrarily select one of the sensor electrodes 301 to 306. Unselected electrodes are preferably grounded or may electrically float. A conductive member 40 is called a guard ring and held at the same potential as that applied to the selected sensor electrode. The guard ring 40 prevents the current flowing through the sensor electrode from flowing beyond the electrode area, thereby allowing accurate measurement of the distance between the electrode and the object (not shown) to be measured. The same reference numerals as in FIG. 10 denote the same parts in FIG. 1. With this arrangement, the distance between the object (not shown) to be measured and an electrode selected by the switch SW is measured at the position of the electrode.

As a characteristic feature of the variable distance measurement position electrostatic sensor according to the present invention, the distance measurement position can be changed by arbitrarily selecting one of the plurality of sensor electrodes by the change-over switch SW. The surface position detection apparatus of the present invention has a plurality of sensor electrodes that can be switched, and the number of sensor electrodes is not limited to six as in the above example. In this example, the sensor electrodes 301 to 306 are laid out in a line. However, the present invention is not limited to this layout, and any arbitrary layout can be employed. As will be described later, when this apparatus is used as the surface position detection apparatus of a semiconductor exposure apparatus, accurate focus control can be performed because the electrode positions are fixed, unlike an apparatus in which a plurality of electrostatic sensors are switched by a circuit. Switching is preferably electronic switching instead of mechanical switching. The switching timing and sensor electrode selection method will be described later in detail together with application examples.

Figure 2:
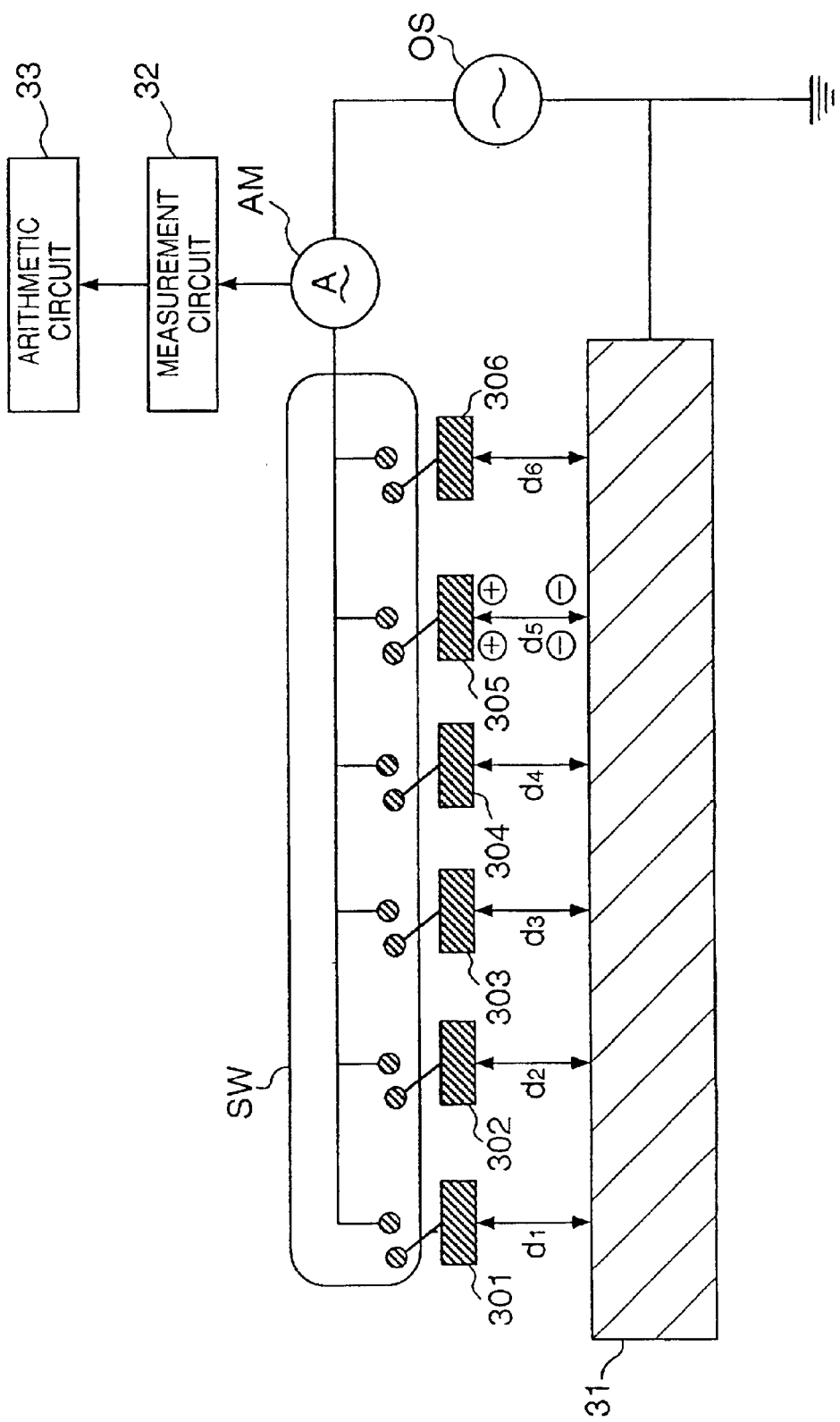
FIG. 2 is an explanatory view of the principle of the variable distance measurement position electrostatic sensor shown in FIG. 1.

FIG. 2 is a view showing the principle of the variable distance measurement position electrostatic sensor shown in FIG. 1. The change-over switch SW arbitrarily selects one of the plurality of sensor electrodes 301 to 306 arranged near an object 31 to be measured and connects the electrode to an electrical circuit. Reference symbols d1 to d6 denote distances between the sensor electrodes 301 to 306 and the conductive substrate 31 at the electrode positions, respectively. The distances may be different from each other depending on the surface shape of the conductive substrate 31. The same reference numerals as in FIG. 10 or 1 denote the same parts in FIG. 2.

As shown in FIG. 2, a high-frequency voltage is applied from an oscillator OS to, e.g., the electrode 305 selected by the change-over switch SW from the electrodes 301 to 306. An ammeter AM is connected between the change-over switch SW and oscillator OS. The magnitude of the AC current flowing to the selected electrode 305 is measured by the ammeter AM and a measurement device (circuit) 32 connected to the ammeter AM. The current measurement result is input to an arithmetic circuit 33. The distance d5 between the selected electrode 305 and the object 31 to be measured is measured by arithmetic processing by the arithmetic circuit 33.

Figure 3:
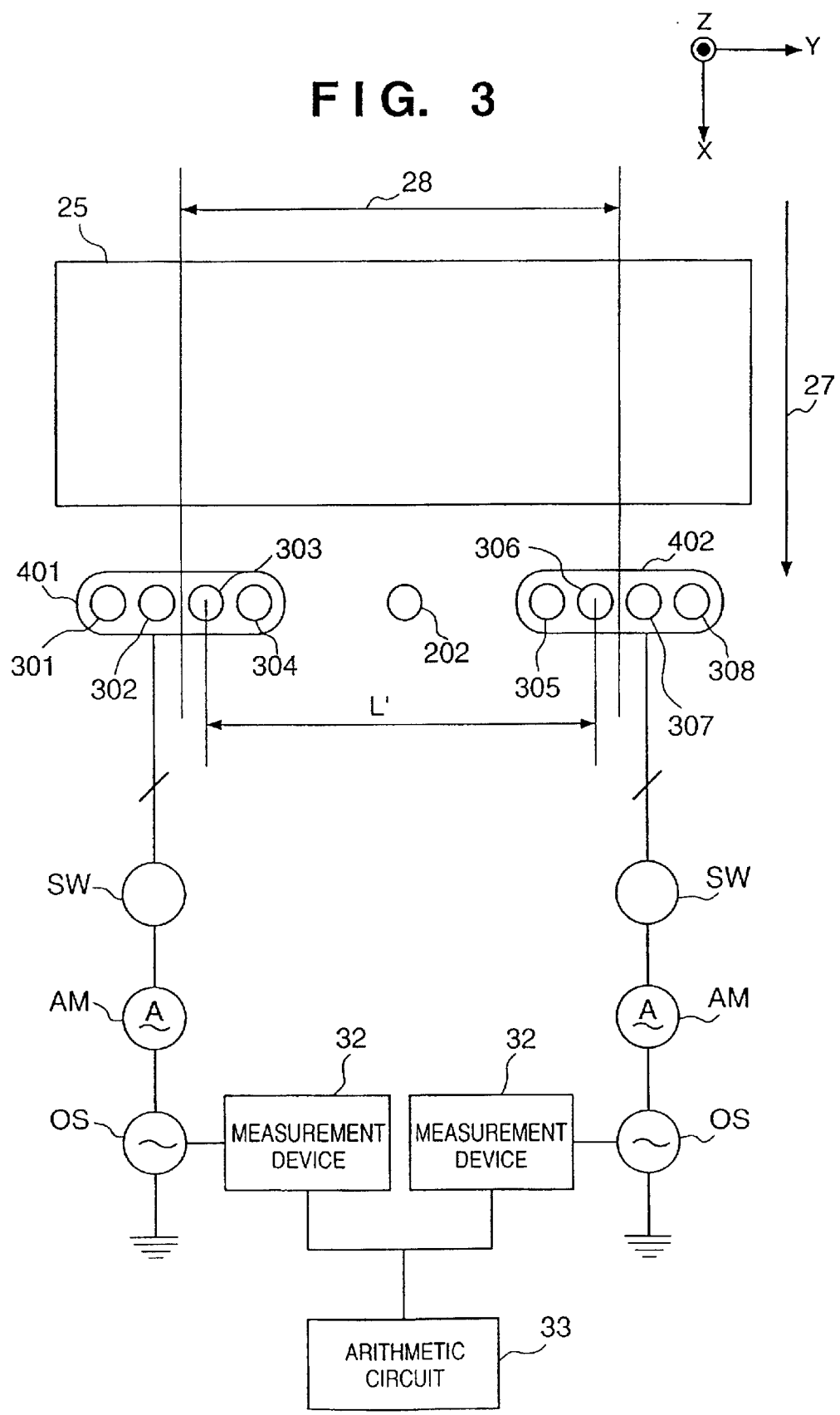
FIG. 3 is a view showing an application example of the variable distance measurement position electrostatic sensor shown in FIG. 1 when viewed from the direction of the exposure optical axis.

FIG. 3 is a view for explaining an example in which the variable distance measurement position electrostatic sensor shown in FIGS. 1 and 2 is applied as the sensors 20 and 20' for calculating the tilt angle of a wafer in the exposure apparatus shown in FIG. 11. Variable distance measurement position electrostatic sensors 401 and 402 are used to calculate the tilt angle. Reference numerals 301 to 308 denote sensor electrodes. The sensor electrodes 301 to 304 construct the variable distance measurement position electrostatic sensor 401, and the sensor electrodes 305 to 308 construct the variable distance measurement position electrostatic sensor 402. An exposure width 28 depends on the chip size formed on a wafer. Only a wafer portion positioned within this width is exposed. Reference symbol L' denotes the distance between sensor electrodes used to calculate the tilt angle. The same reference numerals as in FIG. 12 denote the same parts in FIG. 3. A measurement circuit comprising the switch SW, ammeter AM, oscillator OS, and measurement device 32 is connected to each of the sensors 401 and 402, as in FIGS. 1 and 2. The outputs from the two measurement devices 32 are supplied to the arithmetic circuit 33. The switch SW, ammeter AM, oscillator OS, and measurement device 32 may be shared by the sensors 401 and 402.

With this arrangement, the sensor electrode for detecting the tilt angle can be switched to an arbitrary sensor electrode by the switch SW to arbitrarily change the measurement position for tilt angle detection. As in FIGS. 12 and 13, the sensor 202 is used to detect the height to the surface of the object to be measured.

Figure 19:
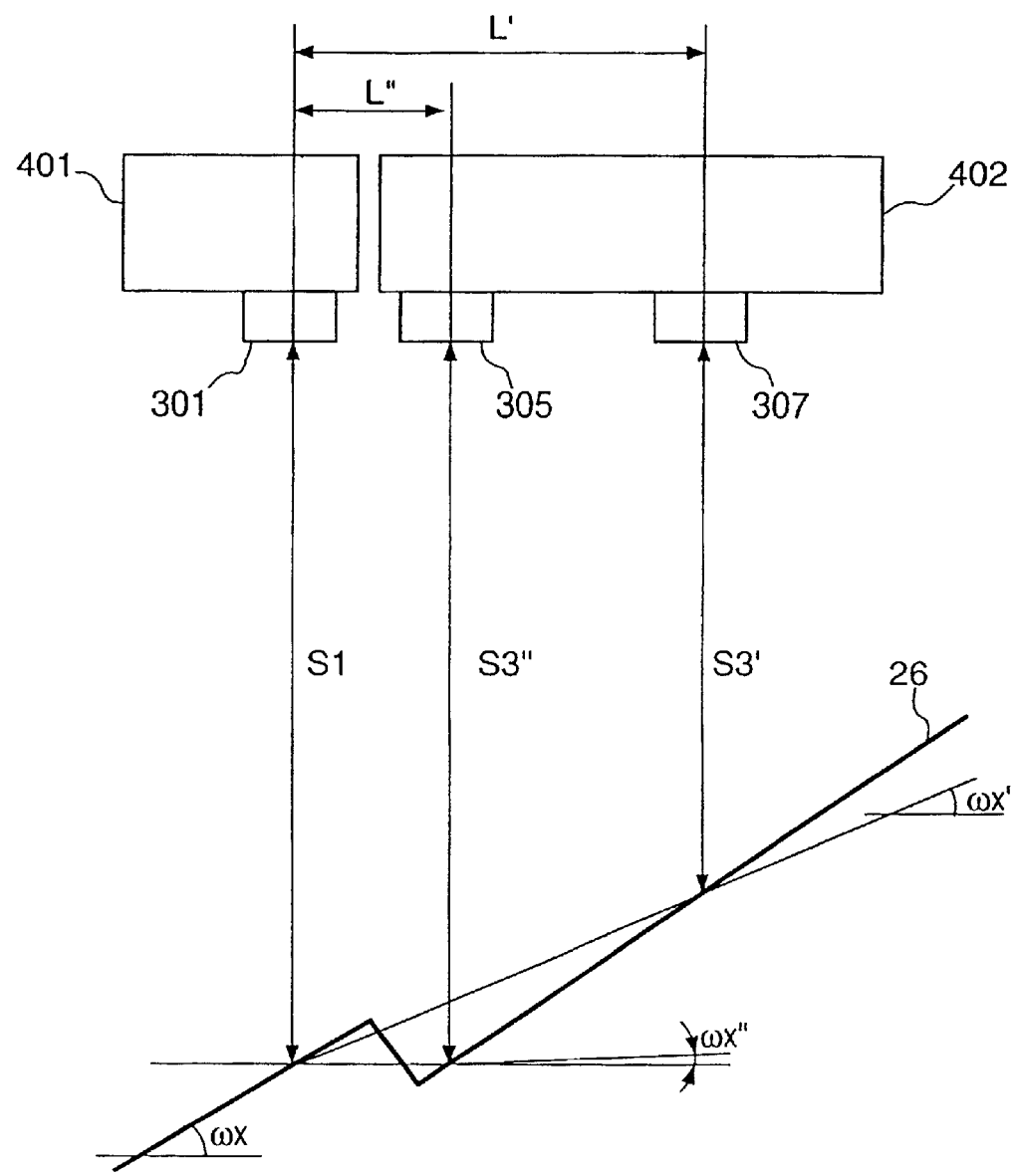
FIG. 19 is an explanatory view of the criterion for selecting a sensor electrode of a tilt angle detection sensor formed from the sensor shown in FIG. 1.

FIG. 19 is an explanatory view of a sensor electrode selection method. The variable distance measurement position electrostatic sensors 401 and 402 are used to calculate the tilt angle of a wafer. The sensor electrode 301 constructs the variable distance measurement position electrostatic sensor 401, and the sensor electrodes 305 and 307 construct the variable distance measurement position electrostatic sensor 402. Reference numeral 26 denotes the surface of a wafer (object to be measured). For illustrative convenience, the sensor for detecting the height and the remaining sensor electrodes are omitted. The same reference numerals as in FIG. 3 and the like denote the same parts in FIG. 19.

As shown in FIG. 19, as the sensor electrode of one sensor 401 for detecting the tilt angle, the sensor electrode 301 is used. As the sensor electrodes of the other sensor 402, the sensor electrodes 305 and 307 are used. In this case, tilt angles are obtained as per $\omega x''=(S1-S3'')/L''$ and $\omega x'=(S1-S3')/L'$. When these tilt angles are compared with the actual tilt angle $\omega x$, $\omega x \approx \omega x'$, $\omega x <> \omega x''$. More specifically, when an electrode separated from another sensor electrode by a larger distance (in this case, the sensor electrode 307 because $L'>L''$) is used, the influence of the minute structure on the surface can be made smaller in calculating the tilt angle, so the tilt angle can be accurately measured. That is, an outermost electrode within the exposure width is used as the sensor electrode for detecting the tilt angle.

In the example shown in FIG. 3, from the electrodes 303 to 306 positioned within the exposure width 28, not the electrodes 304 and 305 but the electrodes 303 and 306 that maximize the distance $L'$ between the sensor electrodes are selected. As a consequence, yawing of the object to be measured can be accurately measured, and accurate focus control can be performed. Selection of sensor electrodes and actual processing of selecting the sensor electrodes by using the switch are automatically done according to a program stored in the surface position detection apparatus. Since the user need not be aware of the algorithm or perform any operation, a cumbersome operation is unnecessary, and no errors occur.

Figure 10:
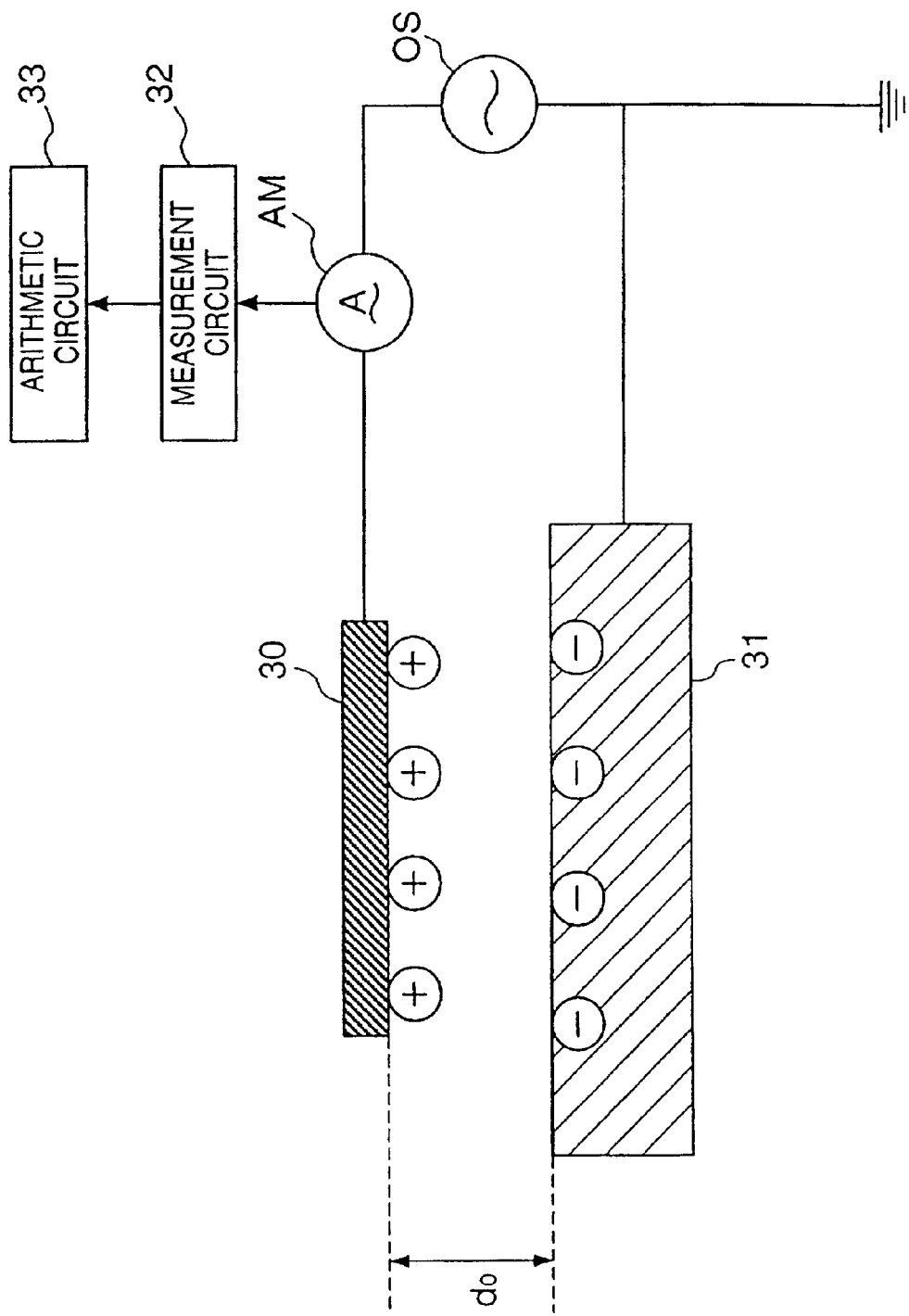
FIG. 10 is an explanatory view of the principle of distance measurement by the conventional electrostatic sensor.

FIG. 14 is a view for explaining a problem posed when not the application example described with reference to FIG. 3 but the conventional electrostatic sensor shown in FIG. 10 is used for the surface position detection apparatus. The same reference numerals as in FIGS. 3 and 12 denote the same parts in FIG. 14. Referring to FIG. 14, the sensors 201 and 203 for detecting the tilt angle are positioned outside the exposure area. A wafer having a step difference on its surface because of the repeated process of forming layers has a large step difference between the interior and exterior of the exposure area. For this reason, yawing of the wafer calculated on the basis of the distance between the sensor electrode and the wafer surface, which is detected outside the exposure area, and yawing of the surface within the exposure area, which needs to be actually measured, do not match. Accordingly, accurate focus control cannot be performed. However, as described with reference to FIG. 3, when the electrostatic sensor according to the present invention is used as a tilt angle detection sensor, the problem described with reference to FIG. 14 can be solved.

Figure 4:
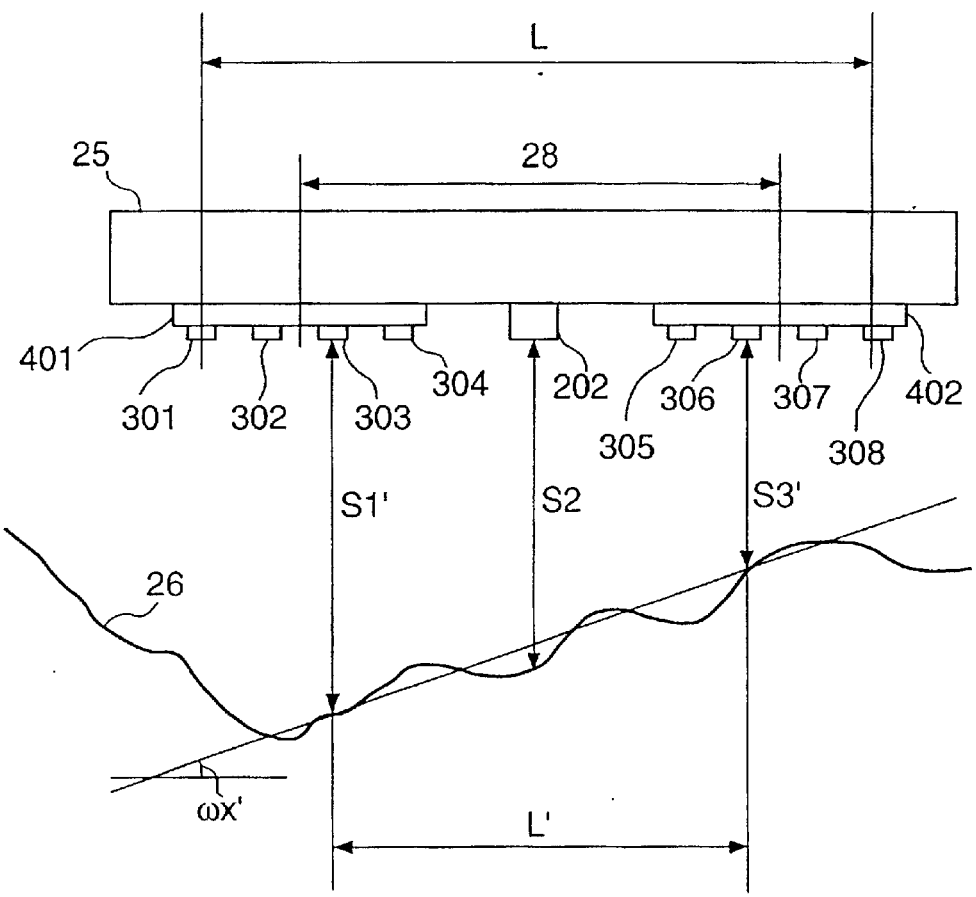
FIG. 4 is a view showing the application example of the variable distance measurement position electrostatic sensor shown in FIG. 1 when viewed from the scanning direction.

FIG. 4 is a view for explaining an application example shown in FIG. 3 that uses the variable distance measurement position electrostatic sensor of the present invention when viewed from the scanning direction. The same reference numerals as in FIG. 3 denote the same parts in FIG. 4. As in FIG. 3, when the electrodes 303 and 306 falling within the exposure width 28 are used to calculate the tilt angle, the actual tilt angle $\omega x'$ [rad.]=$(S1'-S3')/L'$ [rad.] can be calculated from the distances $S1'$ and $S3'$ measured using these electrodes. Hence, accurate focus position control can be performed. The height $Z=S2$ to the object to be measured is detected using the electrode 202, as in the prior art.

Figure 15:
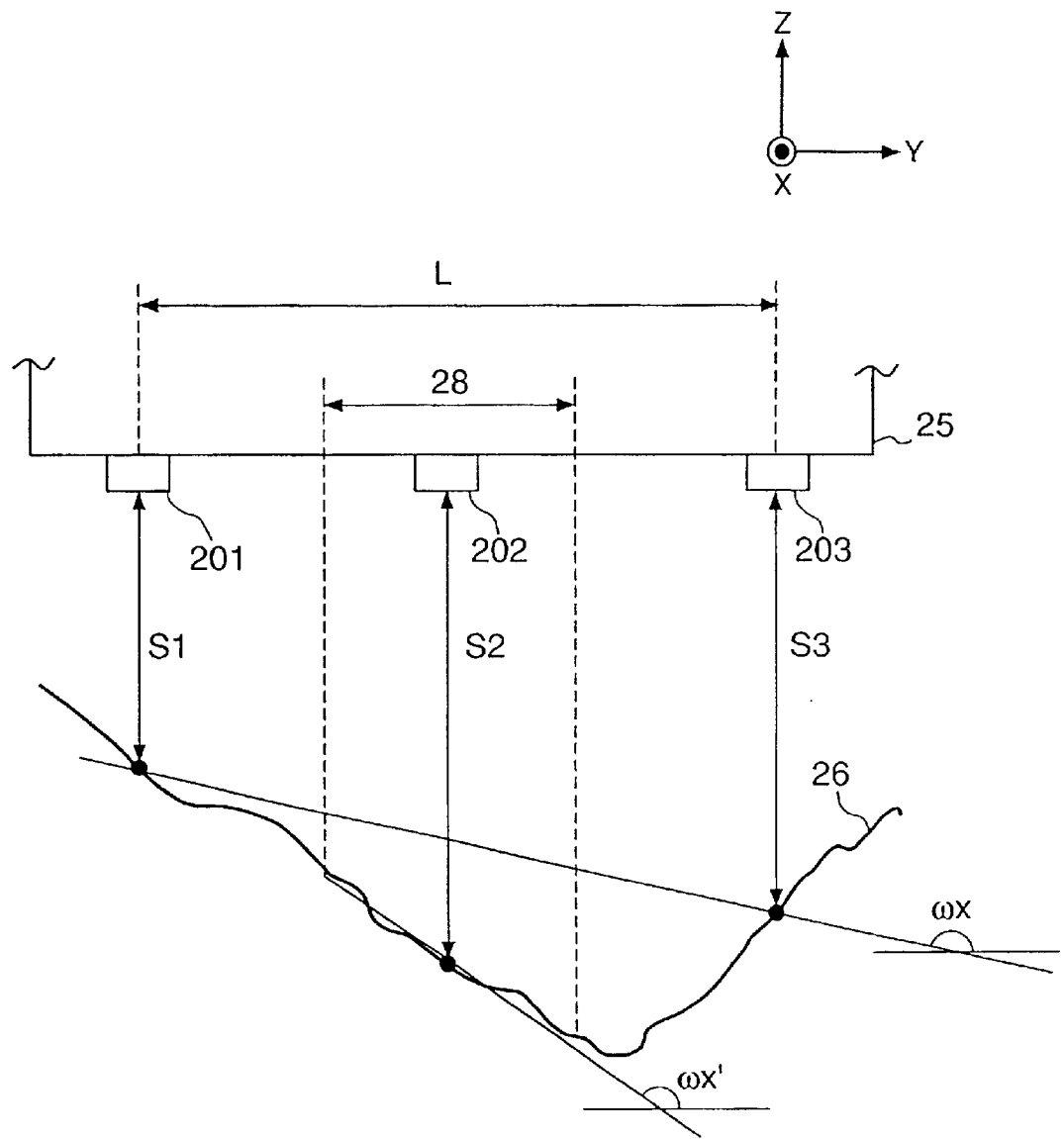
FIG. 15 is an explanatory view of the second problem of the conventional surface position detection apparatus that uses electrostatic sensors.

FIG. 15 is a view for explaining another problem posed when not the application example described with reference to FIG. 4 but the conventional electrostatic sensor shown in FIG. 10 is used for the surface position detection apparatus when viewed from the scanning direction. The same reference numerals as in FIG. 12 or 14 denote the same parts in FIG. 15. When the exposure width 28 is smaller than the distance $L$ between sensors, measurement is performed outside the exposure area. For this reason, the tilt angle $\omega x$ [rad.]=$(S1-S3)/L$ [rad.] calculated from the values $S1$ and $S3$ detected by the sensors 201 and 203 may largely differ from the actual tilt angle $\omega x'$ [rad.]. At this time, accurate focus position control cannot be performed. However, as described above with reference to FIG. 4, when the electrostatic sensor according to the present invention is used to detect the tilt angle, the problem described with reference to FIG. 15 can be solved.

Figure 5:
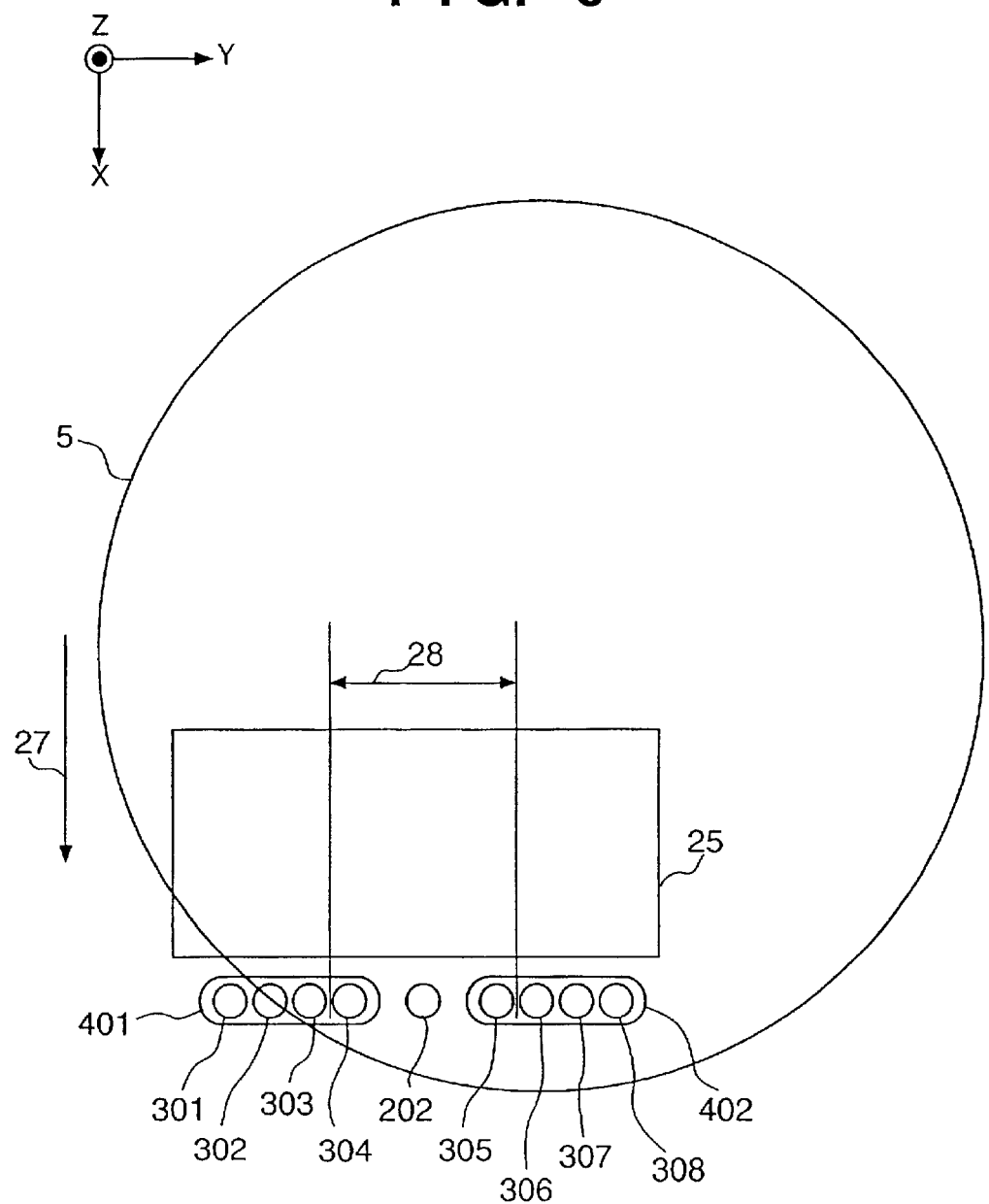
FIG. 5 is a view showing a specific application example of the variable distance measurement position electrostatic sensor shown in FIG. 1.

FIG. 5 is a view for explaining in detail an example of measurement using the variable distance measurement position electrostatic sensor of the first embodiment shown in FIG. 1 as a sensor for detecting the tilt angle. The same reference numerals as in FIG. 3 denote the same parts in FIG. 5. When the tilt angle detection position is switched to the sensor electrodes 304 and 305 positioned within the exposure width 28 using the switch (SW in FIGS. 1 and 2), the tilt angle of the wafer as an object to be measured can be accurately measured. Hence, accurate focus control can be performed. The height to the object to be measured is detected using the electrode 202.

Figure 16:
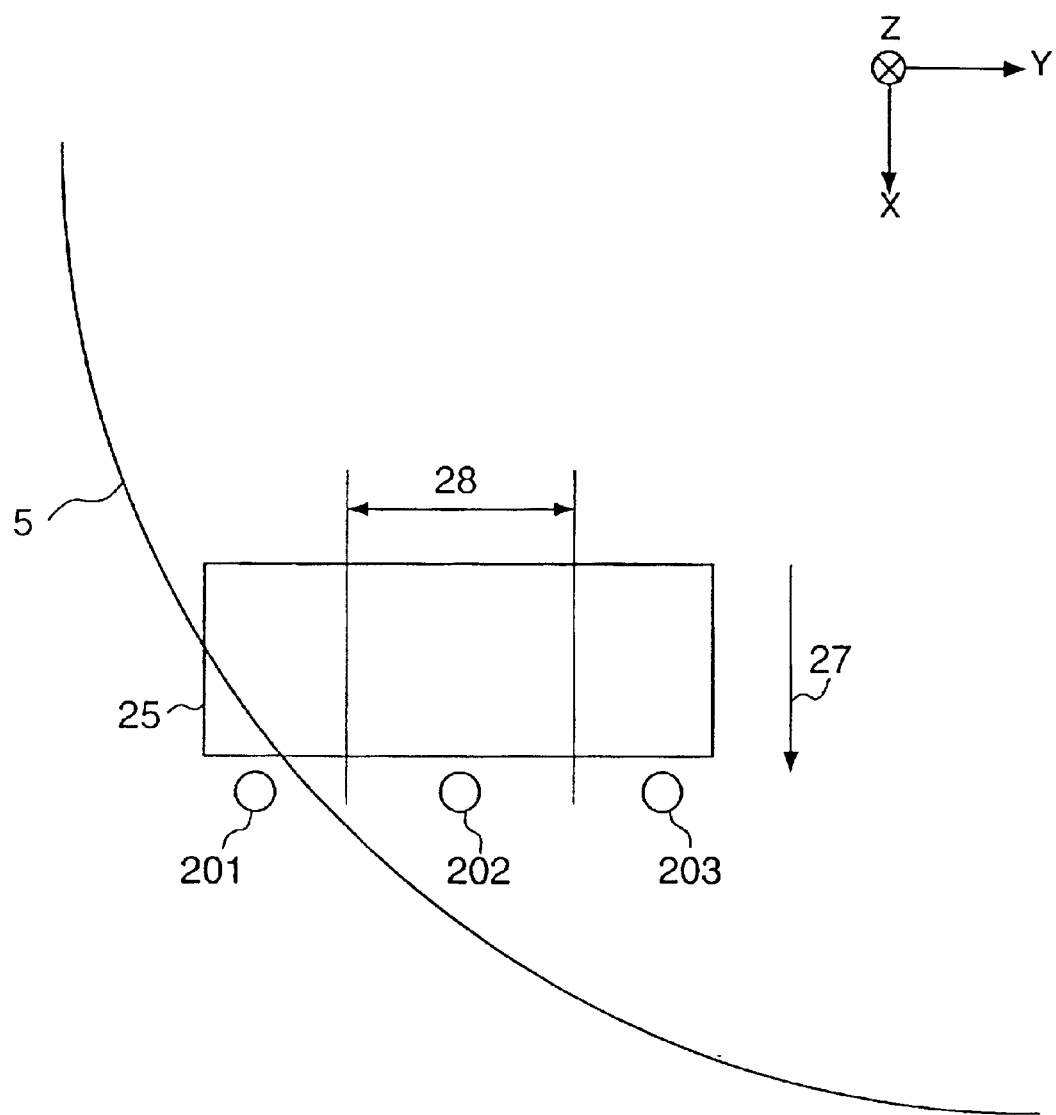
FIG. 16 is an explanatory view of the third problem of the conventional surface position detection apparatus that uses electrostatic sensors.

FIG. 16 is a view for explaining still another problem posed when not the application example described with reference to FIG. 4 but the conventional electrostatic sensor shown in FIG. 10 is used for the surface position detection apparatus. The same reference numerals as in FIG. 3 and the like denote the same parts in FIG. 16. As shown in FIG. 16, when the exposure slit 25 is located near the outer peripheral portion of the wafer 5, a sensor used in the surface position detection apparatus falls outside the range of the wafer, and the distance cannot be accurately measured. For this reason, even when the chip size can be ensured in the exposure area, the chip pattern cannot be printed by exposure, i.e., chips cannot be formed. However, as described with reference to FIG. 5, use of the electrostatic sensor according to the present invention as a tilt angle detection sensor eliminates the conventional problem described with reference to FIG. 16 wherein when the exposure slit is positioned near the outer peripheral portion of the wafer, and some sensors fall outside the wafer range, the distance to the wafer cannot be measured, and exposure cannot be performed.

A method of selecting a sensor electrode to be used, i.e., determining the distance measurement position when the variable distance measurement position electrostatic sensor is applied as a sensor for calculating the tilt angle will be described next. As described with reference to FIG. 5, in the exposure process, the sensor electrode to be selected may change depending on the position of the exposure slit 25. When the exposure slit 25 is positioned near the outer peripheral portion of the wafer 5, a sensor electrode within the area of the wafer must be selected. On the other hand, when the exposure slit 25 is not near the outer peripheral portion, an electrode position determined in advance on the basis of the exposure width calculated immediately after chip layout data is input before the start of an exposure process is selected. That is, a sensor electrode that falls within the exposure width 28 and is located on the outermost side of the area of the wafer is selected.

Figure 6:
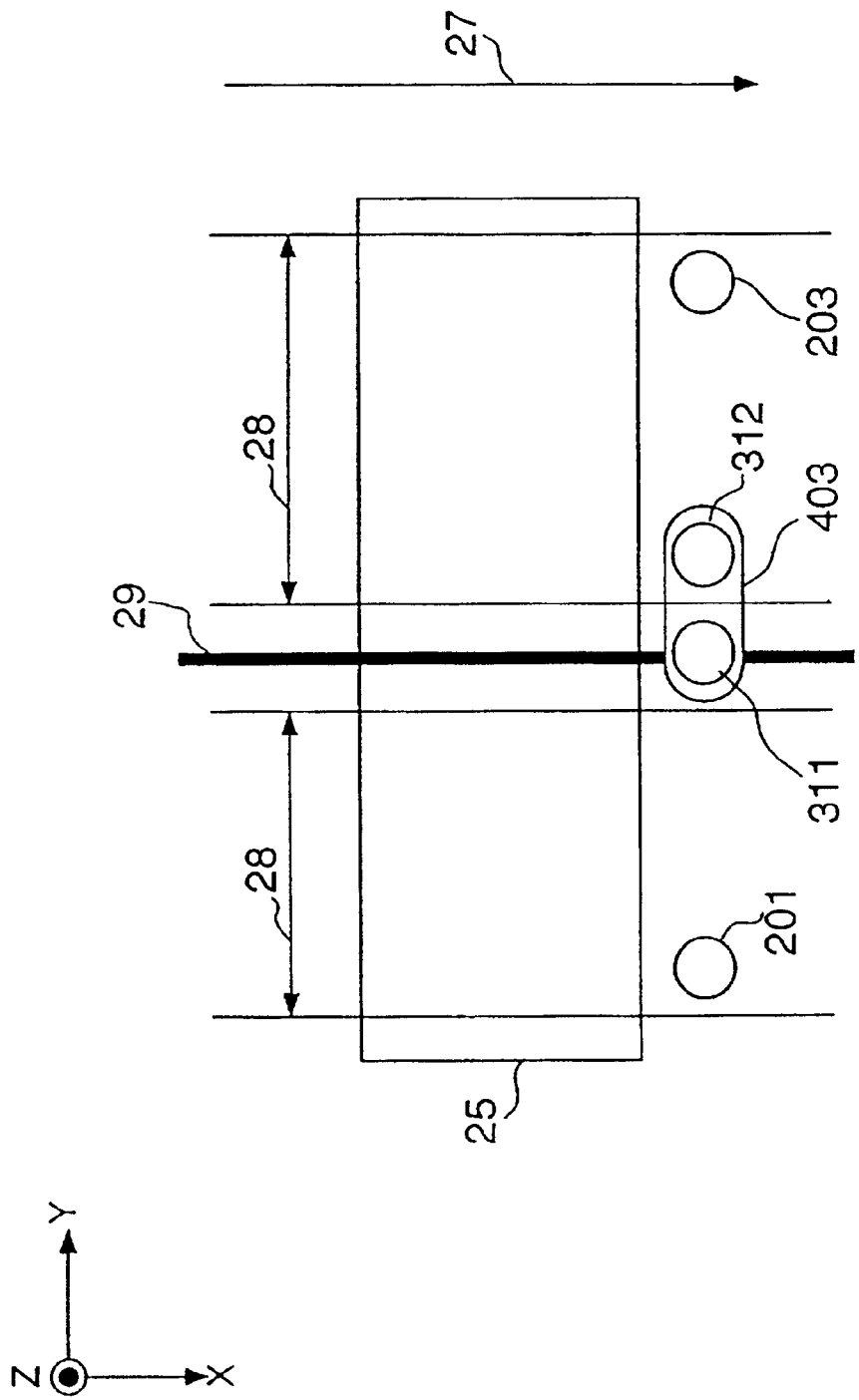
FIG. 6 is a view showing another application example of the variable distance measurement position electrostatic sensor shown in FIG. 1.

FIG. 6 is a view for explaining an example in which the variable distance measurement position electrostatic sensor of this embodiment is applied as a sensor for detecting the height in the surface position detection apparatus. A variable distance measurement position electrostatic sensor 403 is used to detect the height to the surface of the object to be measured. Reference numerals 311 and 312 denote sensor electrodes of the variable distance measurement position electrostatic sensor 403. Reference numeral 29 denotes a scribing line (connection portion) between adjacent chips, which is positioned under the sensor electrode 311. The same reference numerals as in FIG. 3 or 12 denote the same parts in FIG. 6.

In the arrangement shown in FIG. 6, when the sensor electrode to be used in the height detection sensor 403 is switched to an arbitrary one of the sensor electrodes 311 and 312 using a switch (not shown), the sensor electrode (i.e., position of the sensor electrode to be used for detection) for detecting the height to the surface of the object to be measured can be arbitrarily changed. As in FIG. 12 or 13, the sensors 201 and 203 are used to detect the tilt angle. When the scribing line 29 is positioned beneath the sensor electrode 311, as shown in FIG. 6, the sensor electrode is switched to the sensor electrode 312 positioned within the exposure width 28 using the switch (not shown) to detect the height. With this arrangement, the distance to the surface of the object to be measured can be accurately measured, and accurate focus control can be performed.

Selection of the sensor electrode and actual processing of selecting the sensor electrode by using the switch are automatically done according to a program stored in the surface position detection apparatus. Since the user need not be aware of the algorithm or perform any operation, a cumbersome operation is unnecessary, and no errors occur. Switching is performed on the basis of the chip layout data before the start of an exposure process. The reason for this is as follows. Since the chip layout (pattern) is common to one wafer and does not change during exposure of the wafer, the sensor electrode used to detect the height does not change during the exposure process. The sensor electrode to be used to detect the height is determined on the basis of the exposure width determined from the data.

Figure 17:
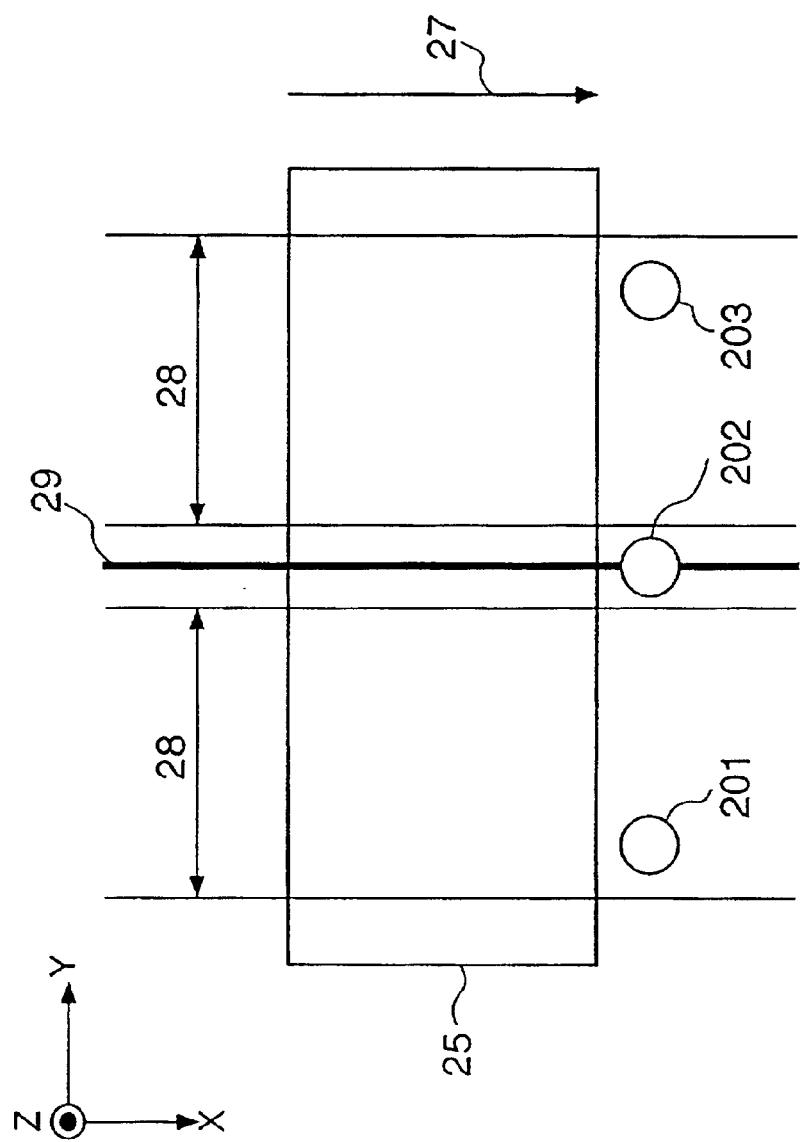
FIG. 17 is an explanatory view of the fourth problem of the conventional surface position detection apparatus that uses electrostatic sensors.
Figure 18:
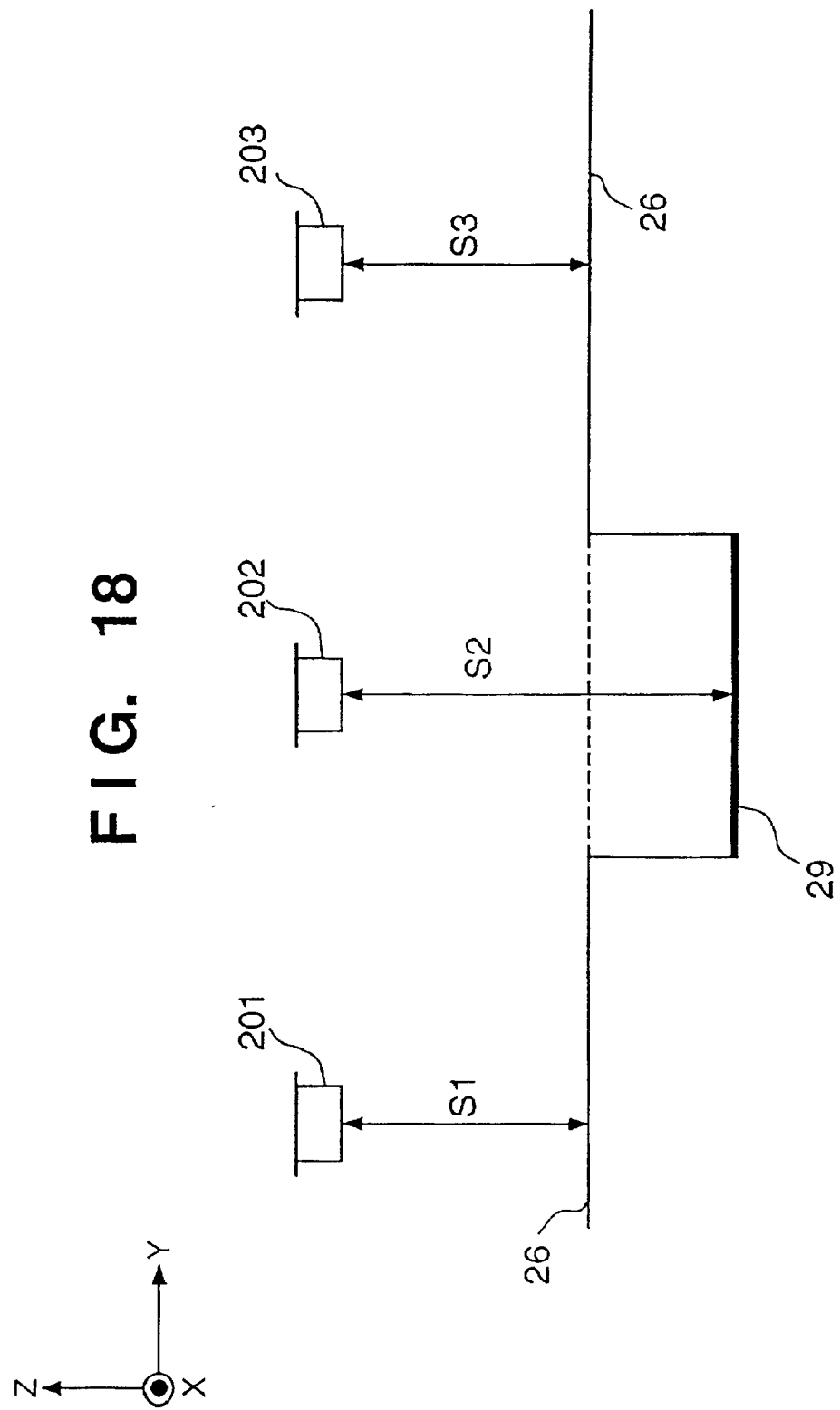
FIG. 18 is an explanatory view of the fourth problem of the conventional surface position detection apparatus that uses electrostatic sensors.

FIG. 17 is a view for explaining still another problem posed when not the application example described with reference to FIG. 6 but the conventional electrostatic sensor shown in FIG. 10 is used for the surface position detection apparatus when viewed from the direction of the optical axis. FIG. 18 is a view for explaining this problem when viewed from the scanning direction. The same reference numerals as in FIG. 6 or 14 denote the same parts in FIGS. 17 and 18. Referring to FIGS. 17 and 18, the scribing line 29 is present within the exposure slit 25. As shown in FIG. 18, even for a plurality of different chip patterns including this chip pattern, the scribing line 29 is positioned underneath the electrostatic sensor 202 for detecting the height Z. For this reason, the distance, i.e., the height to the surface of the object to be measured, which is to be actually detected, cannot be measured. Hence, accurate focus control cannot be performed. However, as described above with reference to FIG. 6, when the electrostatic sensor according to the present invention is used as the height detection sensor, the problem described with reference to FIGS. 17 and 18 can be solved.

(Second Embodiment)

Figure 7:
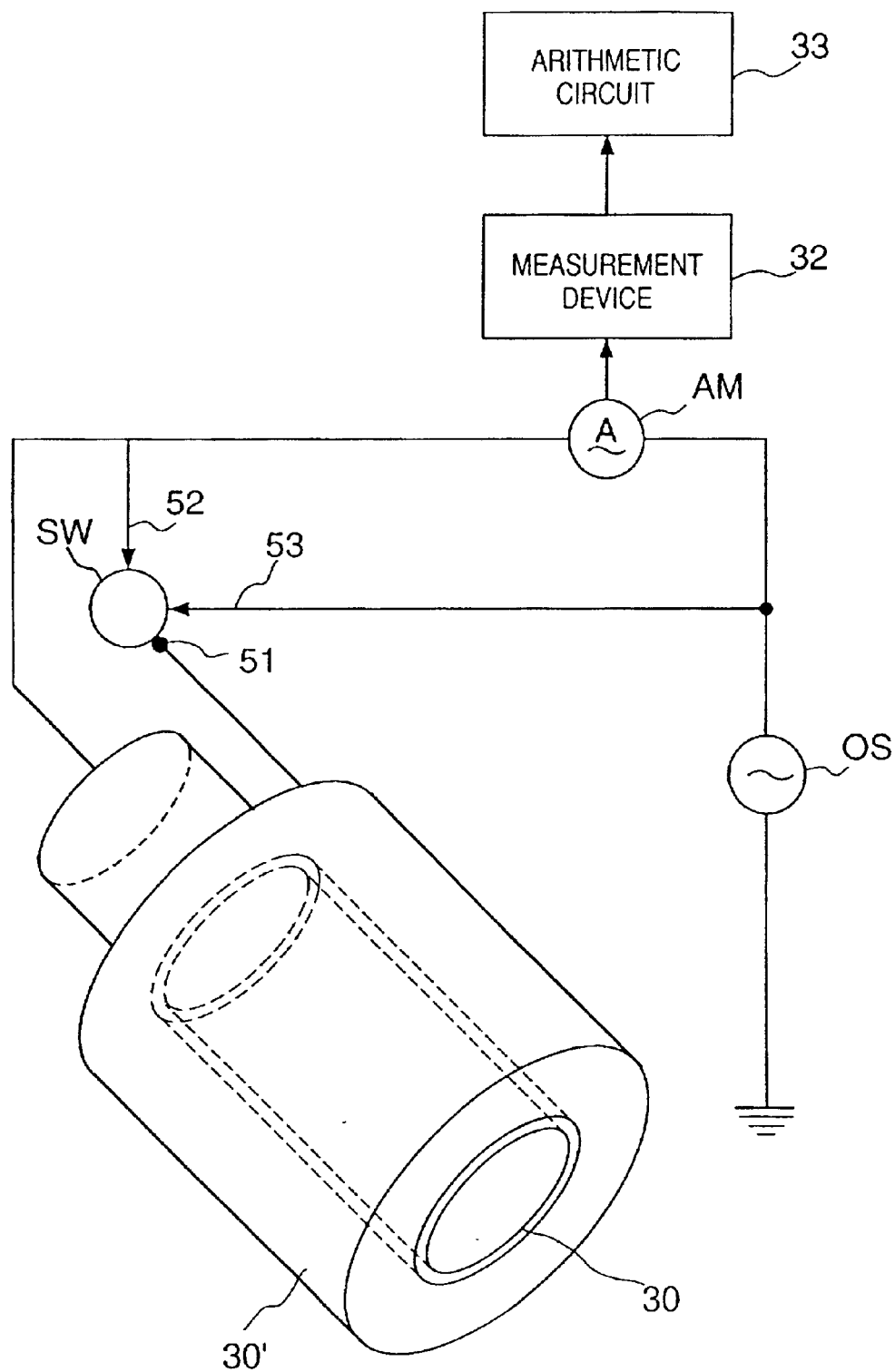
FIG. 7 is an explanatory view showing the detection area variable electrostatic sensor of a surface position detection apparatus according to the second embodiment of the present invention.

FIG. 7 is a view that best illustrates the characteristic feature of the detection area variable electrostatic sensor of a surface position detection apparatus according to the second embodiment of the present invention. As shown in FIG. 7, in this sensor, a terminal 51 is connected to one of terminals 52 and 53 by a switch SW. Reference numeral 30 denotes a sensor electrode; and 30', an electrode functioning as a sensor electrode only when the terminal 51 is connected to the terminal 52 by the switch SW. When the terminal 51 is connected to the terminal 53, only the electrode 30 functions as a sensor electrode, and the electrode 30' functions as a guard ring. The electrodes 30 and 30' have sections concentric with each other.

As shown in FIG. 7, a high-frequency voltage is applied from an oscillator OS to only the electrode 30 or both the electrodes 30 and 30' by the change-over switch SW. An ammeter AM is connected between the change-over switch SW and oscillator OS. The magnitude of the AC current flowing to only the electrode 30 or both the electrodes 30 and 30' is measured by the ammeter AM and a measurement device 32 connected to the ammeter AM. The current measurement result is input to an arithmetic circuit 33. The distance d5 between the electrode 30 and a wafer as an object to be measured is measured by arithmetic processing by the arithmetic circuit 33.

In the first embodiment, the detection position can be changed. In the second embodiment, the detection area (area of the sensor electrode) can be changed. As described above, as one of the characteristic features of the electrostatic sensor, the detection area can be almost uniformly averaged. In the arrangement shown in FIG. 7, since the detection area can be changed, the area to be averaged can be changed.

Figure 8:
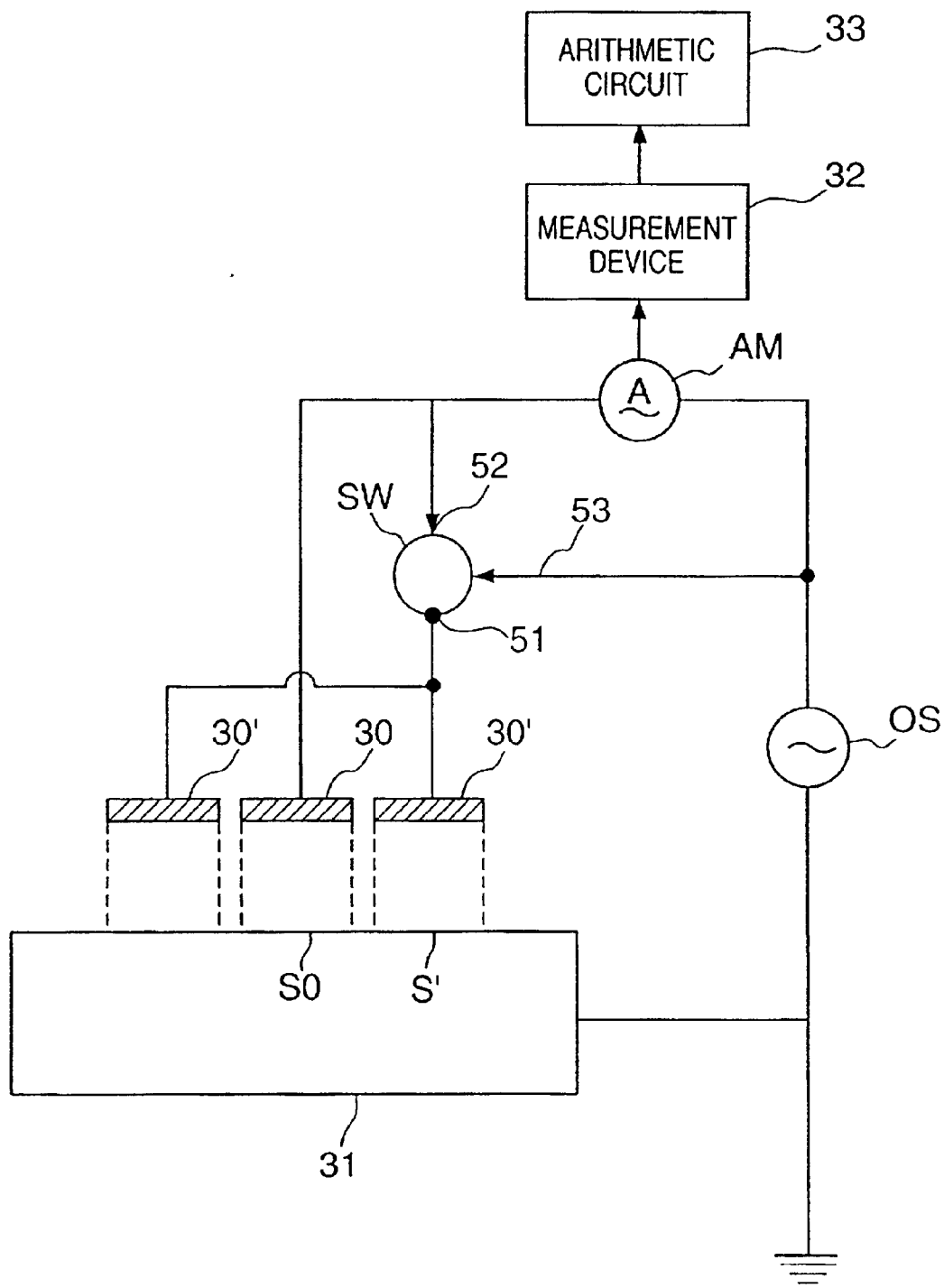
FIG. 8 is an explanatory view of the principle of the sensor shown in FIG. 7.

FIG. 8 is an explanatory view of the principle of the electrostatic sensor shown in FIG. 7, which allows to change the area of the sensor electrode, i.e., the detection area to be averaged. The same reference numerals as in FIG. 7 denote the same parts in FIG. 8. As shown in FIG. 8, when the terminal 51 is connected to the terminal 52 by using the switch SW to make the electrode 30' function as a sensor electrode, the area (S0+S') as the sum of an area S0 of the sensor electrode 30 and an area S' of the electrode 30' can be set as the detection area. Alternatively, by connecting the terminal 51 to the terminal 53 not to make the electrode 30' function as a sensor electrode, only the area (S0) of the sensor electrode 30 can be set as the detection area of the electrostatic sensor.

According to the second embodiment, since the detection area can be changed, the averaging area can be changed, and focus control can be easily performed in accordance with the layout of chips to be formed by exposure.

FIG. 20 is a view for explaining that a conventional problem that defocus occurs depending on the chip layout can be solved by this embodiment, when viewed from the scanning direction. Reference numeral 41 denotes a surface of a memory cell; and 42, a surface of a peripheral circuit. The same reference numerals as in FIG. 7 or 12 denote the same parts in FIG. 20.

Defocus may occur when the height position is adjusted along the surface of an object (resist) to be measured. This will be described with reference to FIG. 20. A device is roughly divided into the portion of the memory cell 41 and the portion of the peripheral circuit 42. Exposure areas where critical resolving performance is required generally concentrate at the portion of the memory cell 41. When only the sensor electrode 30 is used to detect a height position Z, a height S2 to the surface of the peripheral circuit 42 is detected. In this case, defocus occurs on the surface of the memory cell 41 when the height position shown in FIG. 11 is controlled on the basis of the detected height position Z=S2

To prevent this, not only the electrode 39 but also the electrode 30' is used as a sensor electrode using a switch (not shown in FIG. 20), as shown in FIGS. 7 and 8. At this time, a relation S2'<Z'<S2 holds between a detected height position Z', the height S2, and a height position S2' to the surface of the memory cell 41. The specific value of Z' is determined by the area of the memory cell 41 opposing the electrode 30' and that of the peripheral circuit 42. When the area of the electrode 30' is made sufficiently large to widen the detection area, the height position Z', i.e., the focus position can be made close to the height position S2'. Hence, the surface of the memory cell 41 can be set within the focusing range, and the memory cell 41 and peripheral circuit 42 can be properly exposed.

<Embodiment of Device Manufacturing Method>

Figure 21:
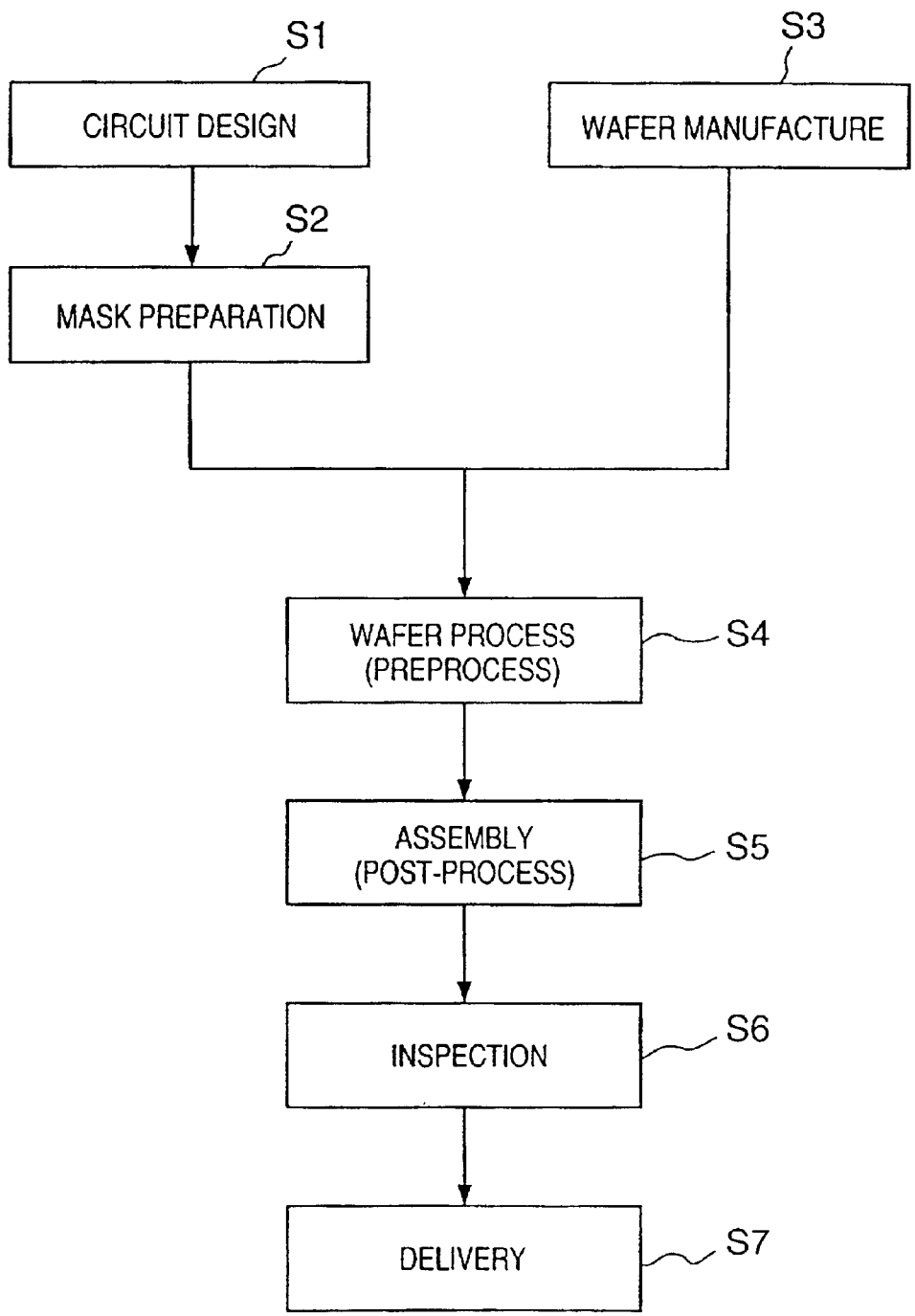
FIG. 21 is a flow chart showing a device manufacturing method using the exposure apparatus of the present invention.

An embodiment of a device manufacturing method using the above-described exposure apparatus will be described next. FIG. 21 shows the flow of manufacturing a microdevice (e.g., a semiconductor chip such as an IC or an LSI, a liquid crystal panel, a CCD, a thin-film magnetic head, or a micromachine). In step 1 (circuit design), the pattern of a device is designed. In step 2 (mask preparation), a mask having the designed pattern is prepared. In step 3 (wafer manufacture), a wafer is manufactured using a material such as silicon or glass. In step 4 (wafer process) called a preprocess, an actual circuit is formed on the wafer by lithography using the prepared mask and wafer. In step 5 (assembly) called a post-process, a semiconductor chip is formed from the wafer prepared in step 4. This step includes processes such as assembly (dicing and bonding) and packaging (chip encapsulation). In step 6 (inspection), inspections including an operation check test and a durability test of the semiconductor device manufactured in step 5 are performed. A semiconductor device is completed with these processes and delivered (step 7).

FIG. 22 shows the detailed flow of the wafer process (step 4). In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a resist is applied to the wafer. In step 16 (exposure), the circuit pattern of the mask is printed on the wafer by exposure using the above-described exposure apparatus or exposure method. In step 17 (development), the exposed wafer is developed. In step 18 (etching), portions other than the developed resist image are etched. In step 19 (resist peeling), the unnecessary resist remaining after etching is removed. By repeating these steps, a multilayered structure of circuit patterns is formed on the wafer.

When the production method of this embodiment is used, a large device which is conventionally difficult to manufacture can be manufactured at low cost.

As has been described above, according to the present invention, even when the state of the surface to be detected changes, the position of the surface to be detected can be accurately detected in correspondence with the change. According to the exposure apparatus to which the present invention is applied, accurate focus control can be performed. Hence, accurate device manufacture is allowed.

In addition, even when the size of the surface to be detected changes, the position of the surface to be detected can be detected by selecting a sensor electrode in correspondence with the change. This allows efficient exposure and efficient device manufacture.

The present invention is not limited to the above embodiments and various changes and modifications can be made within the spirit and scope of the present invention. Therefore, to apprise the public of the scope of the present invention, the following claims are made.

What is claimed is:

1. An electrostatic sensing apparatus having an electrode for sensing a surface position of a shot region in a substrate to which a pattern is transferred by an exposure apparatus, said electrostatic sensing apparatus comprising:

a plurality of the electrodes; and a system which selects at least one electrode from said plurality of electrodes, based on layout information of the shot region to be detected, and calculates the surface position based upon an output of said selected at least one electrode.

2. An apparatus according to claim 1, wherein the layout information includes information of at least one of a dimension in the shot region, a position of the shot region in the substrate, and an arrangement of chip regions in the shot region.

3. An exposure apparatus for transferring a pattern to a shot region in a substrate, said apparatus comprising:

an electrostatic sensor, for sensing a surface position of the shot region, having a plurality of electrodes; and a system which selects at least one electrode from said plurality of electrodes, based on layout information of the shot region to be detected, and calculates the surface position based upon an output of said selected at least one electrode.

4. A method of manufacturing a device, said method comprising steps of:

transferring a pattern to a substrate using an exposure apparatus as defined in claim 3;

developing the substrate to which the pattern has been transferred; and processing the developed substrate to manufacture the device.

5. An apparatus according to claim 3, wherein the layout information includes information of at least one of a dimension of the shot region, a position of the shot region in the substrated, and an arrangement of chip regions in the shot region.

6. An exposure apparatus for transferring a pattern to a shot region in a substrate, said apparatus comprising:

a plurality of electrostatic sensors, for sensing a surface position of the shot region, each having a plurality of electrodes; and a system which selects at least one electrode from said plurality of electrodes of said plurality of electrostatic sensors, based on layout information of the shot region to be detected, and calculates the surface position based upon an output of said selected at least one electrode.

7. A method of manufacturing a device, said method comprising steps of:

transferring a pattern to a substrate using an exposure apparatus as defined in claim 3;

developing the substrate to which the pattern has been transferred; and processing the developed substrate to manufacture the device.

8. A scanning exposure apparatus for transferring a pattern of a mask to a shot region in a substrated by scanning the mask and the substrate relative to a slit-shaped exposure beam, said apparatus comprising:

an electrostatic sensor, for sensing a surface position of the shot region, having a plurality of electrodes arranged in a direction perpendicular to a scanning direction of the mask and the substrate; and a system which selects at least one electrode from said plurality of electrodes, based on layout information of the shot region to be detected, and calculates the surface position based upon an output of said selected at least one electrode.

9. A method of manufacturing a device, said method comprising steps of:

transferring a pattern to a substrate using a scanning exposure apparatus as defined in claim 8;

developing the substrate to which the pattern has been transferred; and procssing the substrate to manufacture the device.

10. An apparatus according to claim 8, wherein said plurality of electrodes are arranged at a plurality of positions in the scanning direction.

11. An apparatus according to claim 8, wherein the layout information includes information of at least one of a dimension of the shot region, a position of the shot region in the substrate, and an arrangement of chip regions in the shot region.

12. A scanning exposure apparatus for transferring a pattern of a mask to a shot region in a substrate by scanning the mask and the substrate relative to a slit-shaped exposure beam, said apparatus comprising:

a plurality of electrostatic sensors, for sensing a surface position of the shot region, each having a plurality of electrodes arranged in a direction perpendicular to a scanning direction of the mask and the substrate; and a system which selects at least one electrode from said plurality of electrodes of one of said plurality of electrostatic sensors based on layout information of the shot region to be detected, and calculates the surface position based upon an output of said selected at least one electrode.

13. A method of manufacturing a device, said method comprisng steps of:

transferring a pattern to a substrate using a scanning exposure apparatus as defined in claim 12;

developing the substrate to which the pattern has been tranferred; and processing the developed substrate to manufacture the device.

14. An apparatus according to claim 12, wherein said plurality of electrostatic sensors are arranged at a plurality of positions in the scanning direction.

15. An apparatus according to claim 12, wherein the layout information includes information of at least one of a dimension of the shot rgion, a position of the shot region in the substrate, and an arrangement of chip regions in the shot region.

\* \* \* \* \*

UNITED STATES PATENT AND TRADEMARK OFFICE
CERTIFICATE OF CORRECTION

PATENT NO. : 7,072,023 B2  
APPLICATION NO. : 10/059294  
DATED : July 4, 2006  
INVENTOR(S) : Hisaaki Oguri et al.

Page 1 of 1

It is certified that error appears in the above-identified patent and that said Letters Patent is hereby corrected as shown below:

COLUMN 3:
Line 21, "device." should read -- devices. --.

COLUMN 4:
Line 8, "determined" should read -- determines --.

COLUMN 14:
Line 61, "electrode 39" should read -- electrode 30 --.

COLUMN 16:
Line 32, "substrated," should read -- substrate, --.
Line 47, "claim 3;" should read -- claim 6; --.
Line 53, "substrated," should read -- substrate, --.

COLUMN 17:
Line 4, the right margin should be closed-up after "and" and "procssing the substrate to manufacture" should be deleted.
Line 5, before "the device." insert -- processing the substrate to manufacture --.

Signed and Sealed this

Second Day of January, 2007

JON W. DUDAS  
*Director of the United States Patent and Trademark Office*